(12) United States Patent
Funaba et al.

(10) Patent No.: US 7,282,791 B2
(45) Date of Patent: Oct. 16, 2007

(54) STACKED SEMICONDUCTOR DEVICE AND SEMICONDUCTOR MEMORY MODULE

(75) Inventors: Seiji Funaba, Tokyo (JP); Yoji Nishio, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 171 days.

(21) Appl. No.: 11/176,292

(22) Filed: Jul. 8, 2005

(65) Prior Publication Data
US 2006/0006516 A1    Jan. 12, 2006

(30) Foreign Application Priority Data
Jul. 9, 2004   (JP)   ............... 2004-202844

(51) Int. Cl.
    *H01L 23/02*   (2006.01)
(52) U.S. Cl. ............... 257/685; 257/686; 257/E25.006; 257/E25.013; 257/E25.018; 257/E25.021; 257/E25.027; 257/E23.085; 257/777
(58) Field of Classification Search ............... 257/685, 257/686, 723, 777, E25.006, E25.013, E25.018, 257/E25.021, E25.027, E23.085, E21.614
See application file for complete search history.

(56) References Cited

U.S. PATENT DOCUMENTS 5,514,907 A * 5/1996 Moshayedi ............... 257/723
6,188,127 B1 * 2/2001 Senba et al. ............... 257/686
6,362,525 B1 * 3/2002 Rahim ............... 257/738

FOREIGN PATENT DOCUMENTS

| JP | 5-554350 A | 3/1993 |
|---|---|---|
| JP | 6-37246 A | 2/1994 |
| JP | 8-51127 A | 2/1996 |
| JP | 11-260999 A | 9/1999 |
| JP | 2003-78109 A | 3/2003 |
| JP | 2003-124439 A | 4/2003 |
| JP | 2003-273321 A | 9/2003 |

* cited by examiner

*Primary Examiner*—Jasmine Clark
(74) *Attorney, Agent, or Firm*—Sughrue Mion Pllc.

(57) ABSTRACT

A semiconductor device module includes a wiring substrate, a plurality of stacked semiconductor devices and a damping impedance circuit. The plurality of stacked semiconductor devices are provided on the wiring substrate and connected with a signal in a stubless manner, and each of the plurality of stacked semiconductor devices comprises a plurality of semiconductor chips which are stacked. The damping impedance circuit is provided for a transmission path of the signal for an uppermost semiconductor chip as the furthest one, from the wiring substrate, of the plurality of semiconductor chips of a first stacked semiconductor device as one of the plurality of stacked semiconductor devices which is first supplied with the signal.

28 Claims, 23 Drawing Sheets

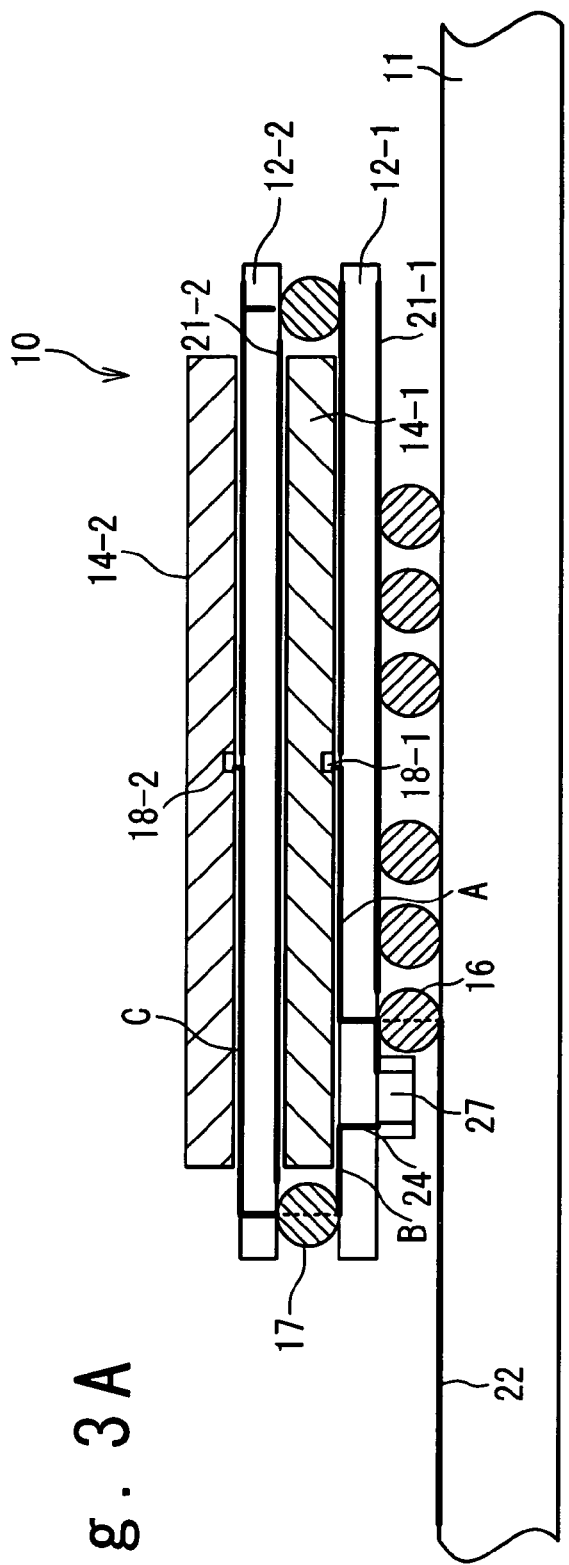
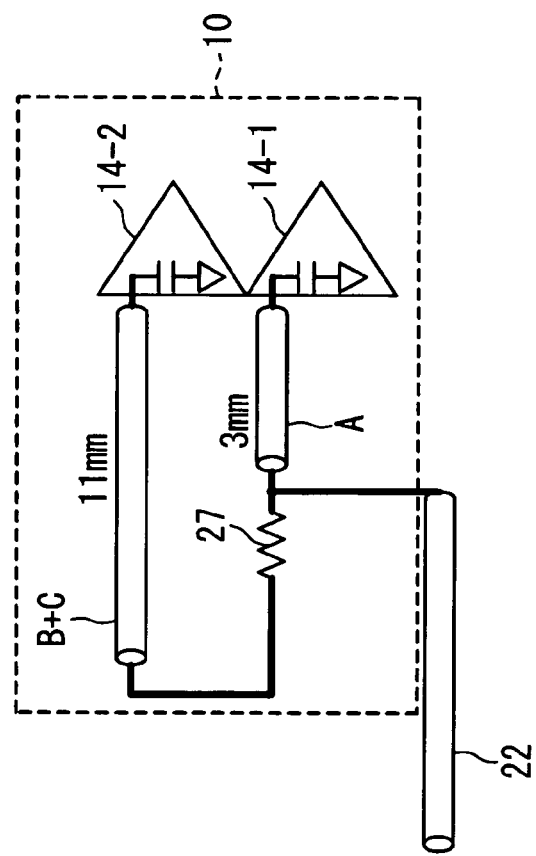

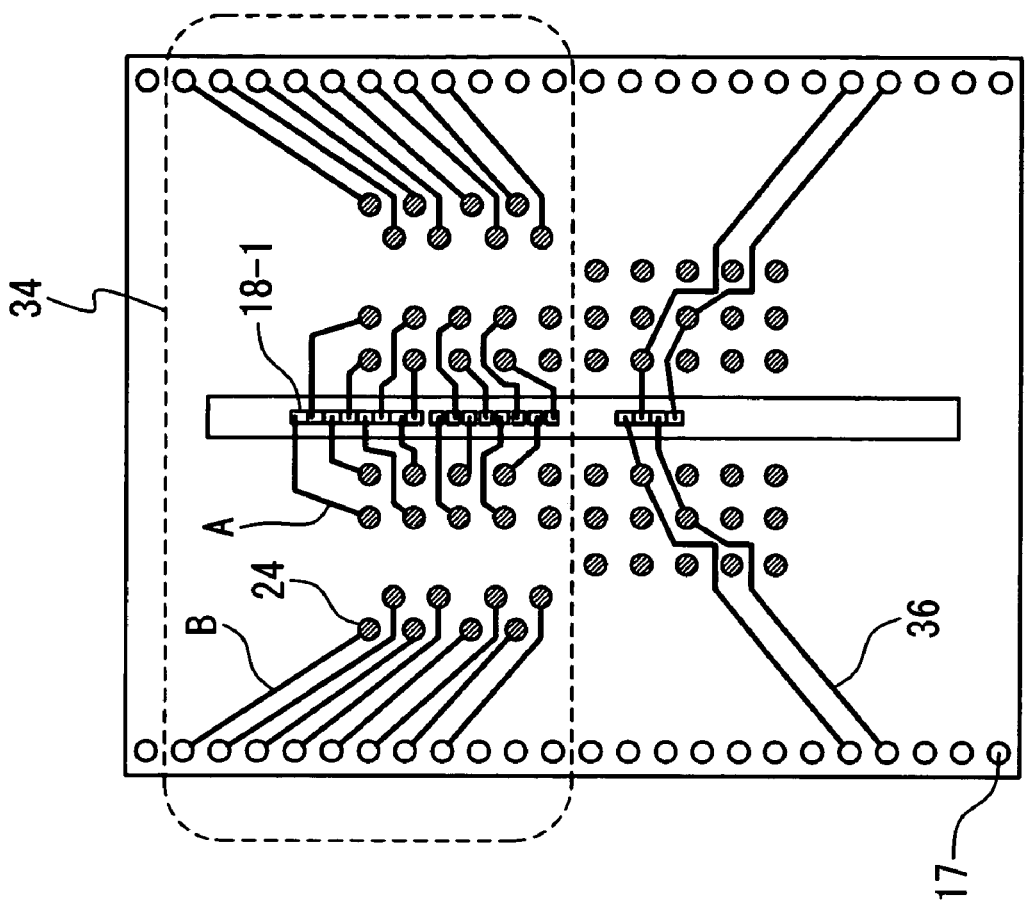
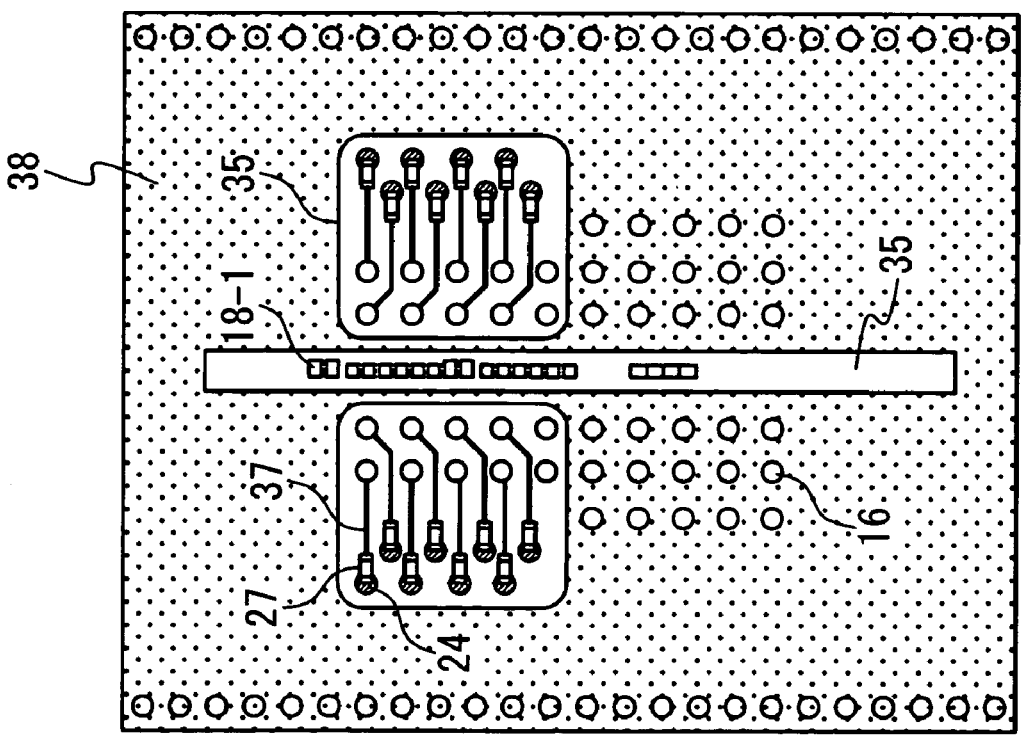

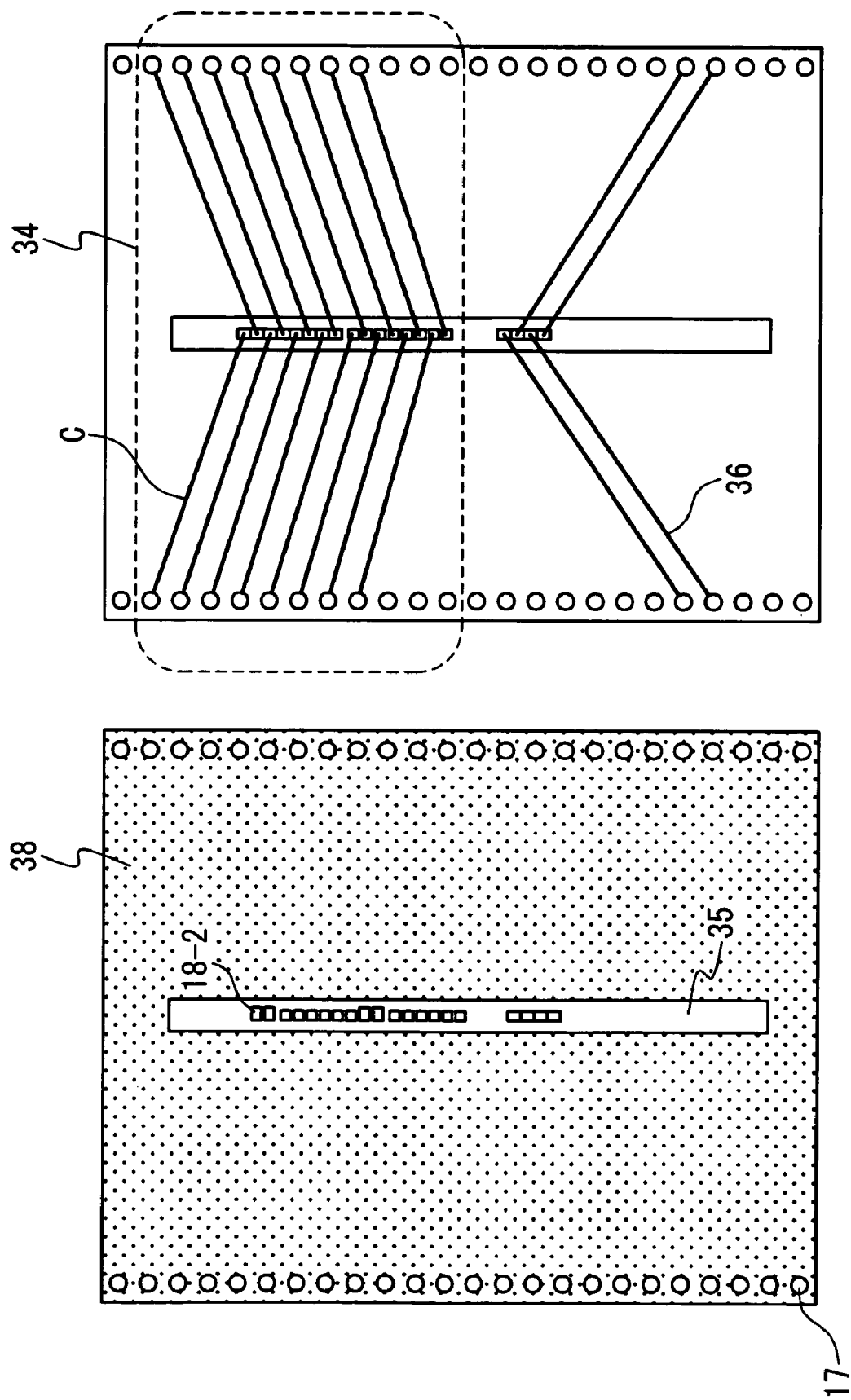

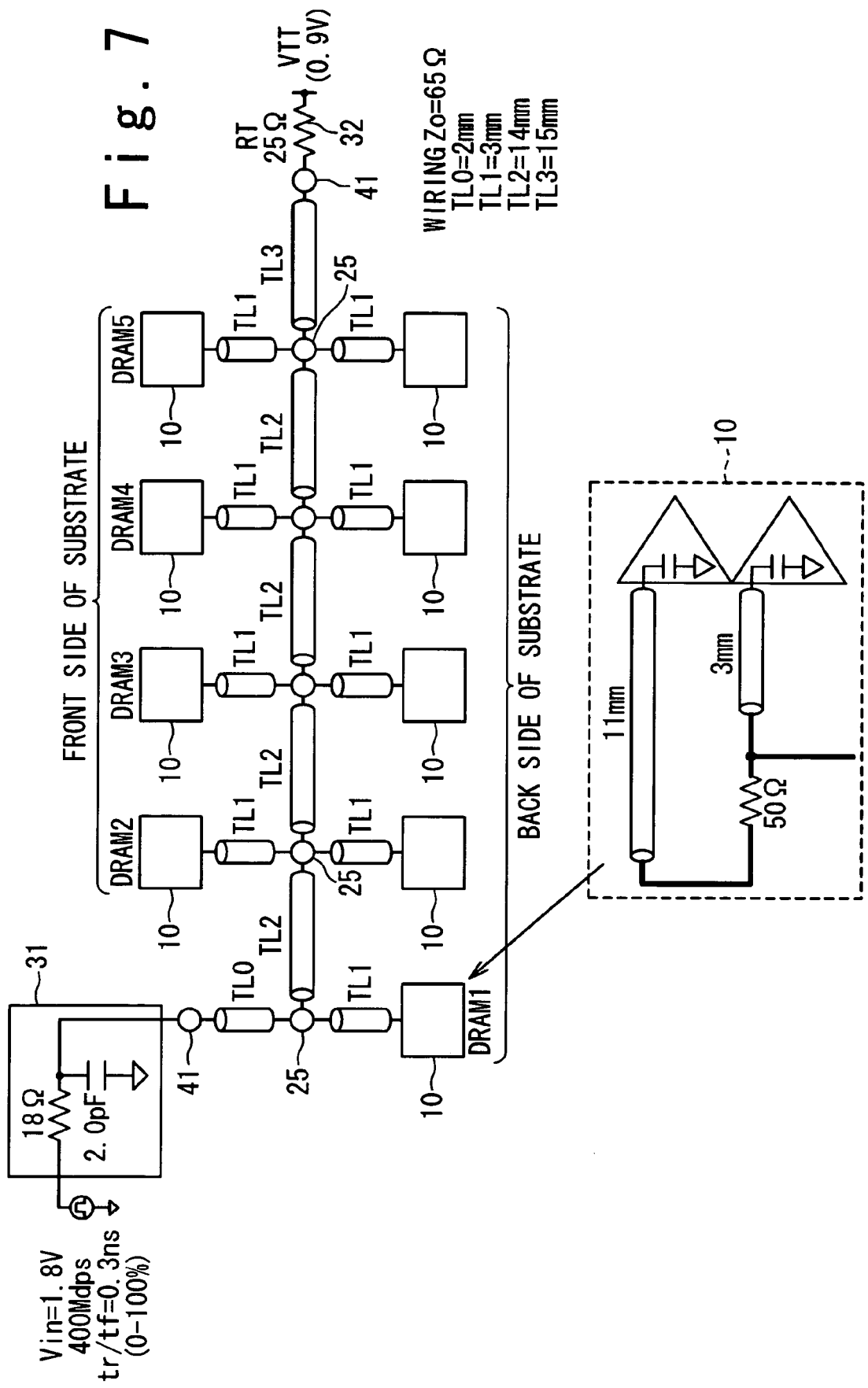

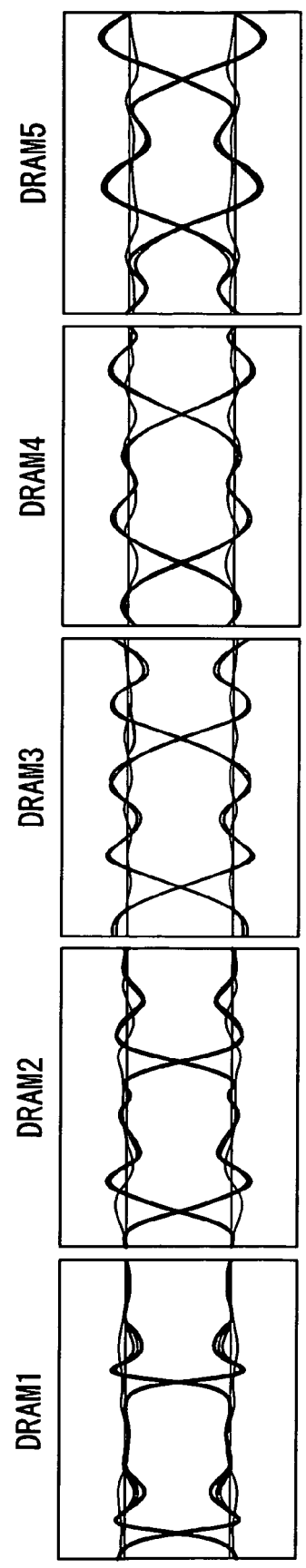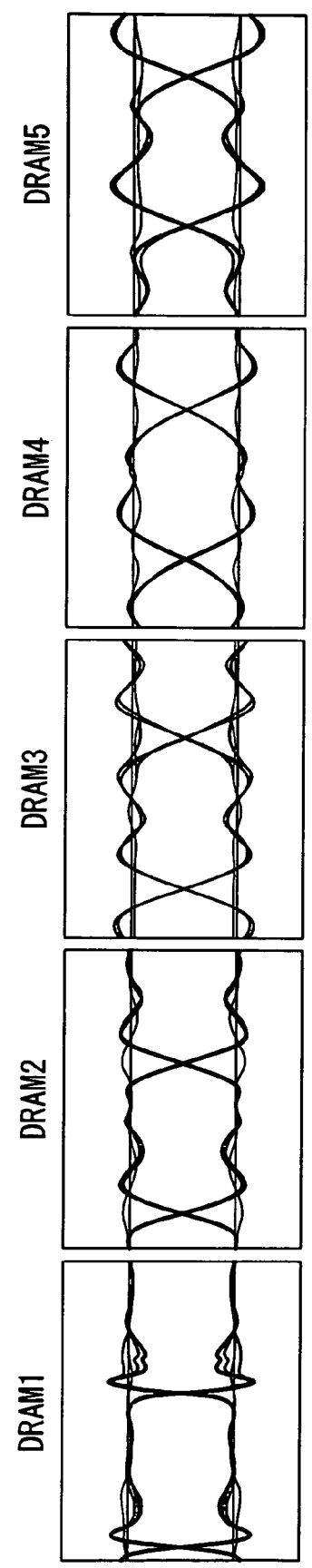

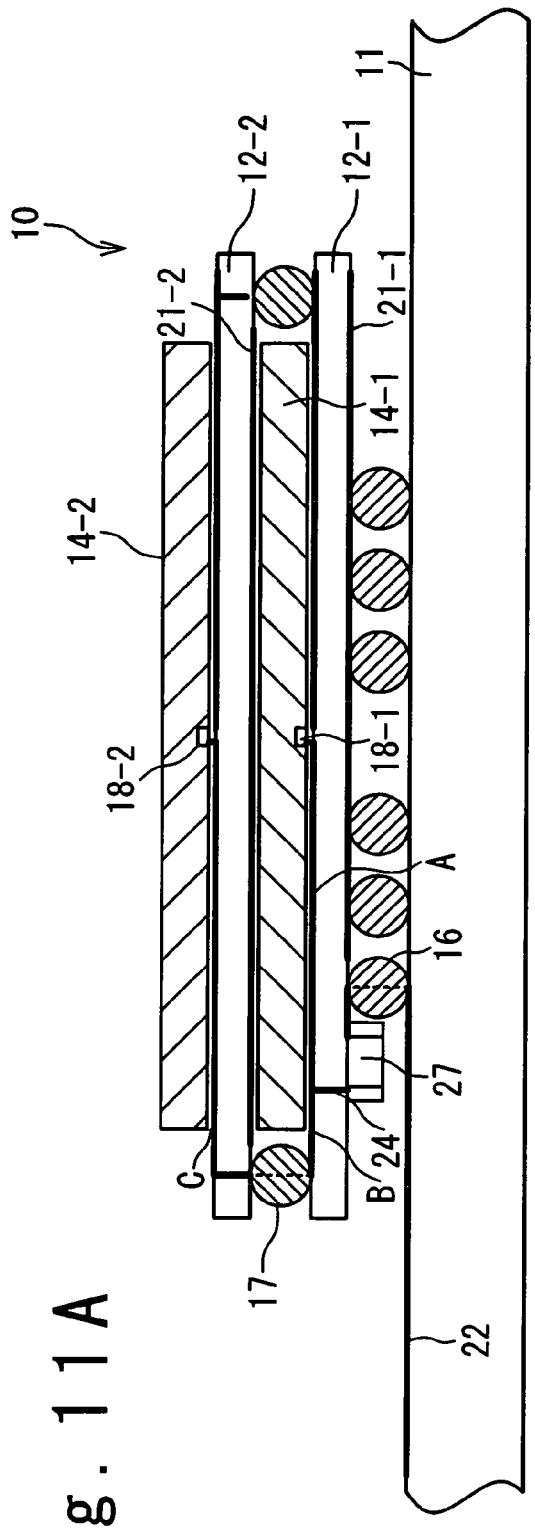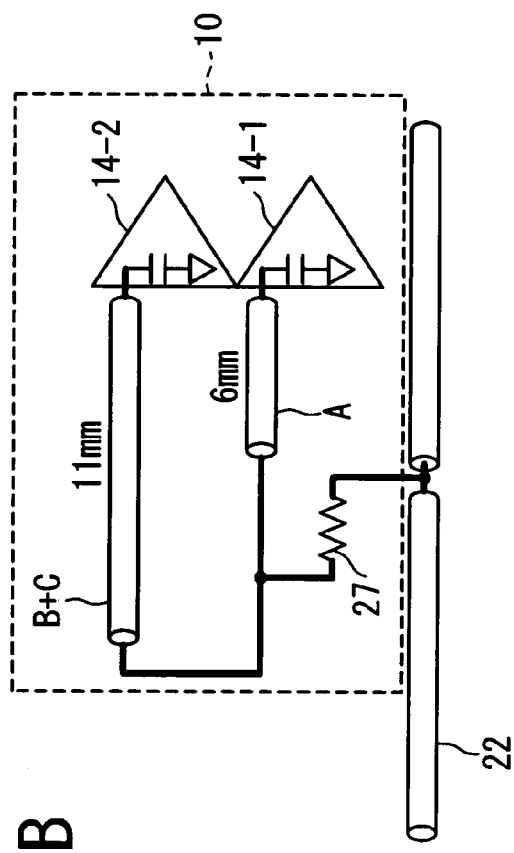
Fig. 11A
Fig. 11B

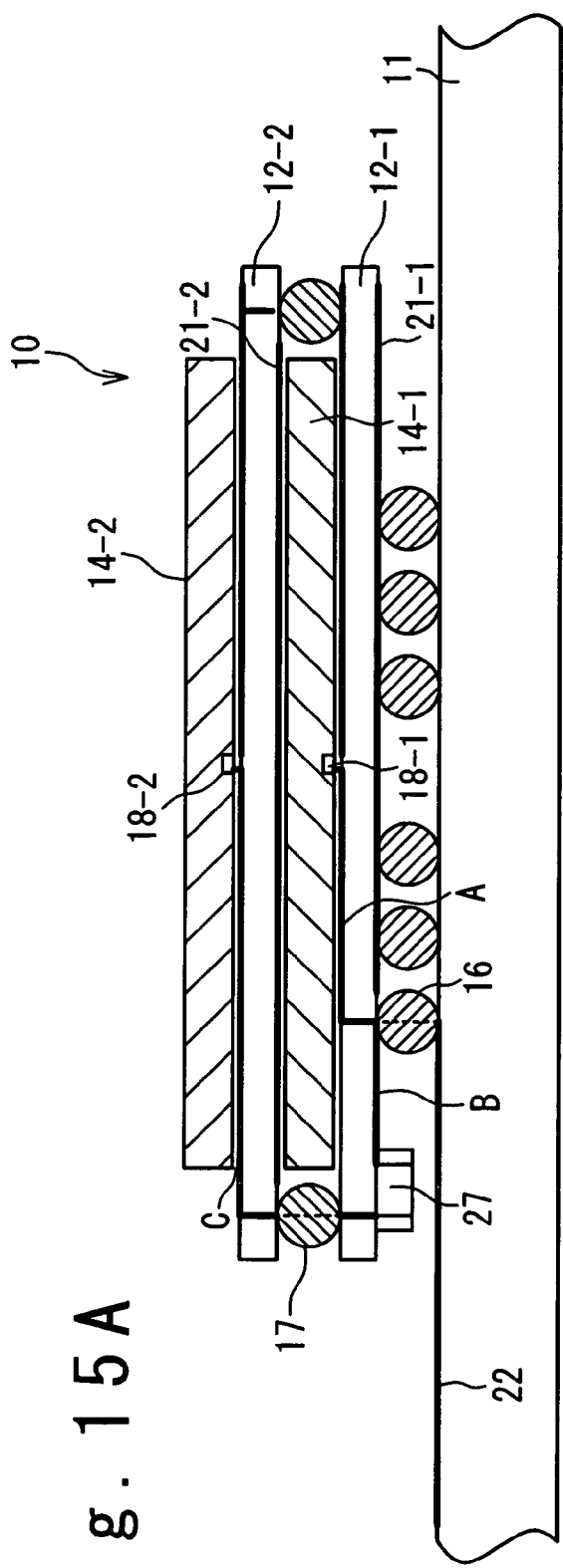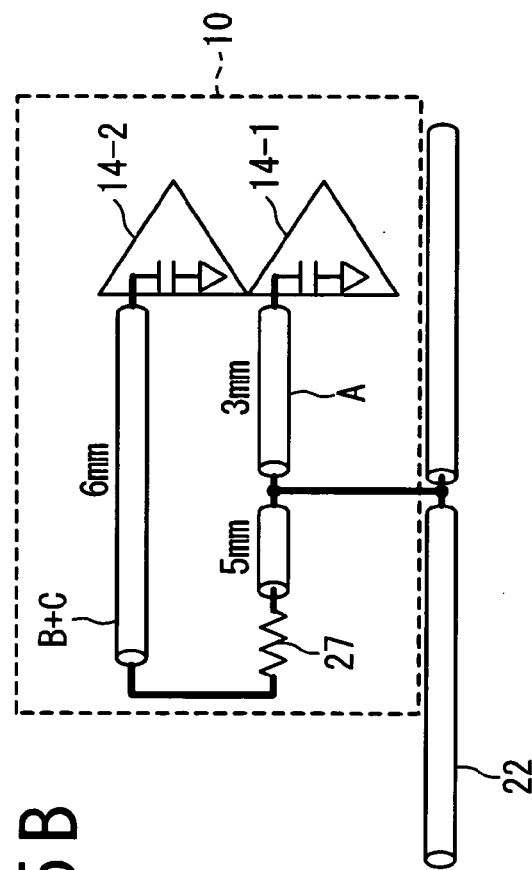
Fig. 15A
Fig. 15B

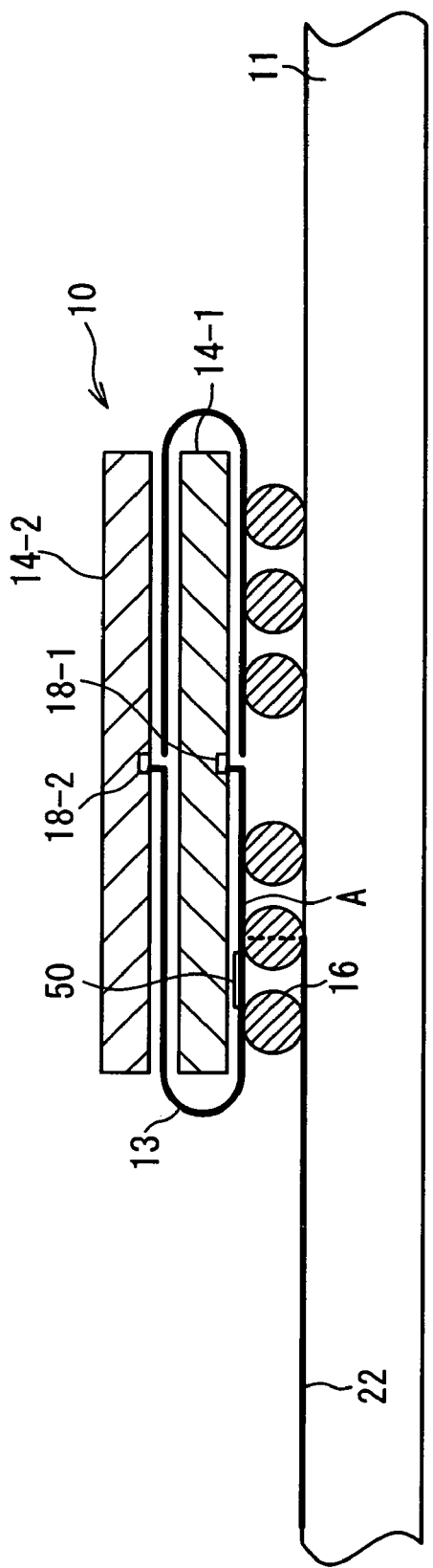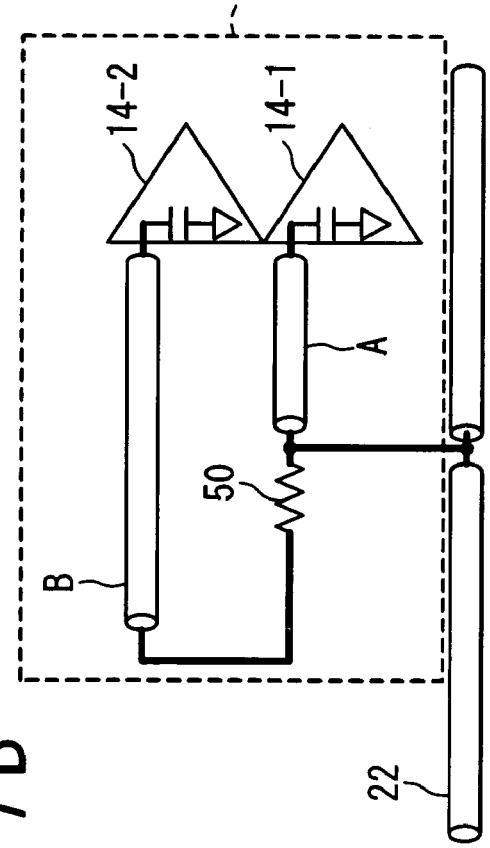

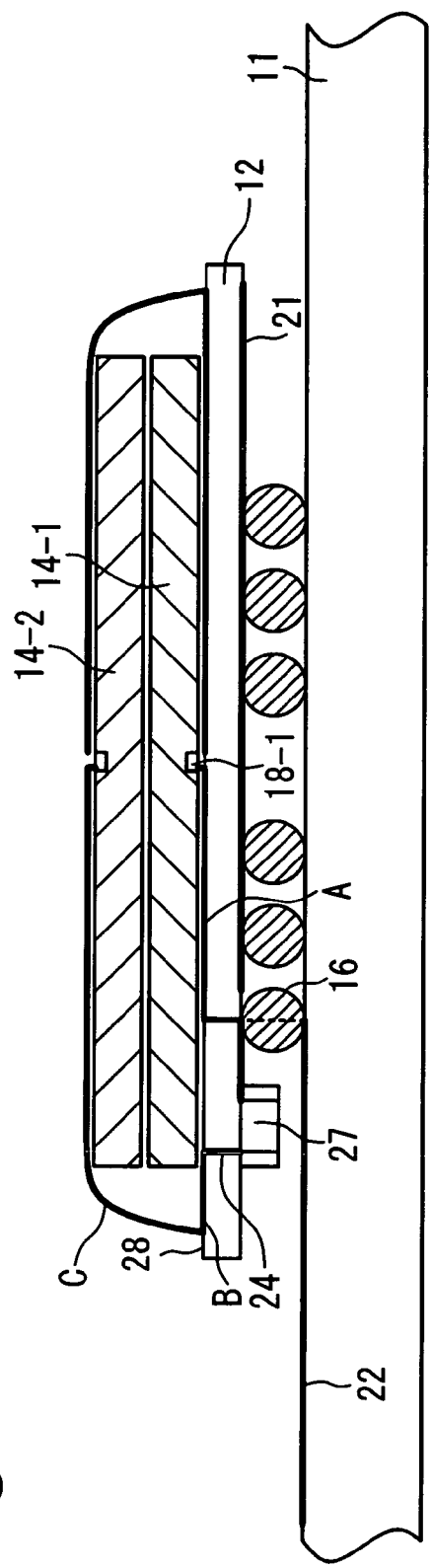
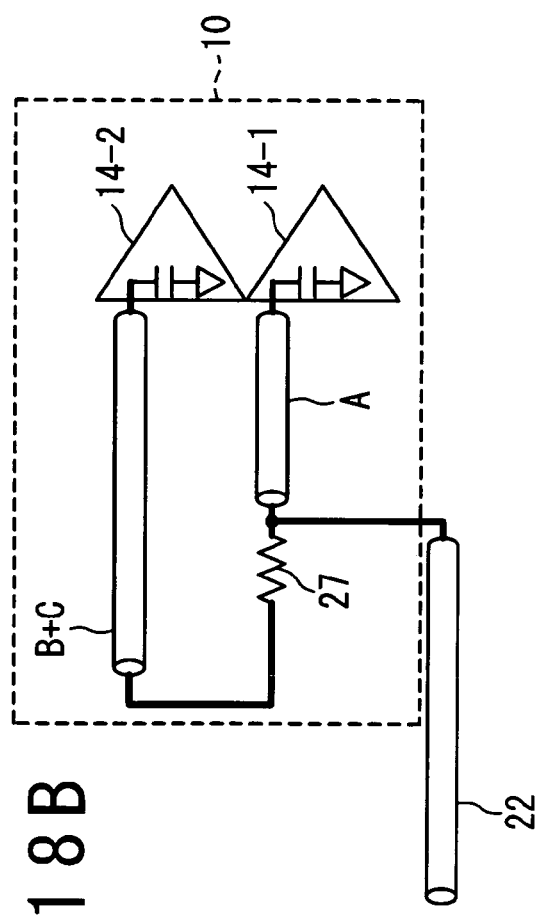
Fig. 18A
Fig. 18B

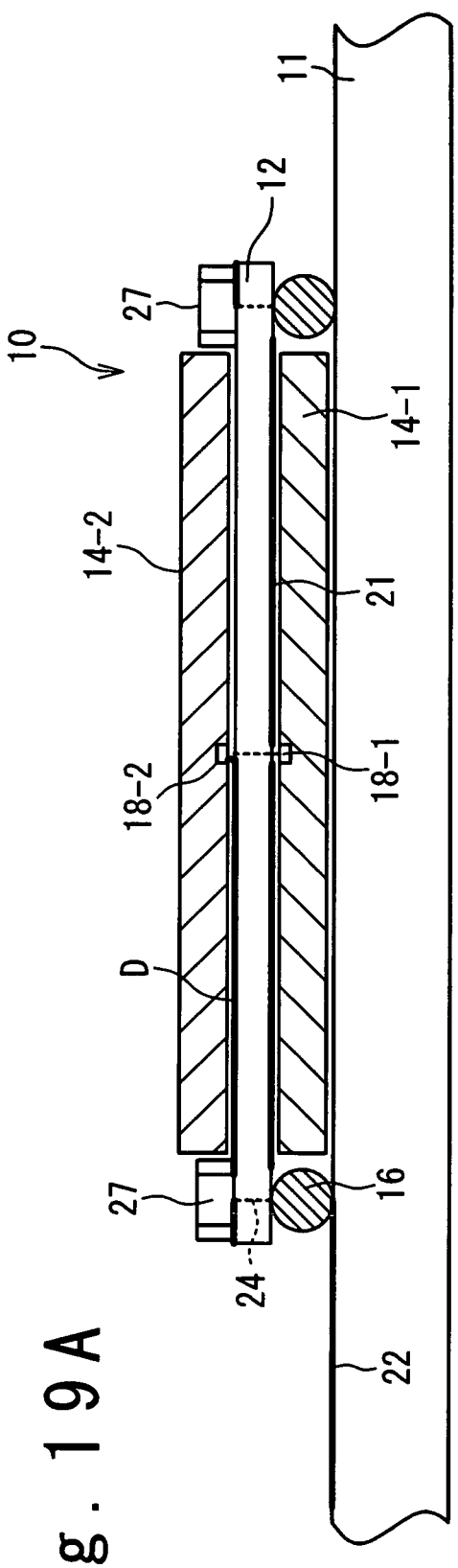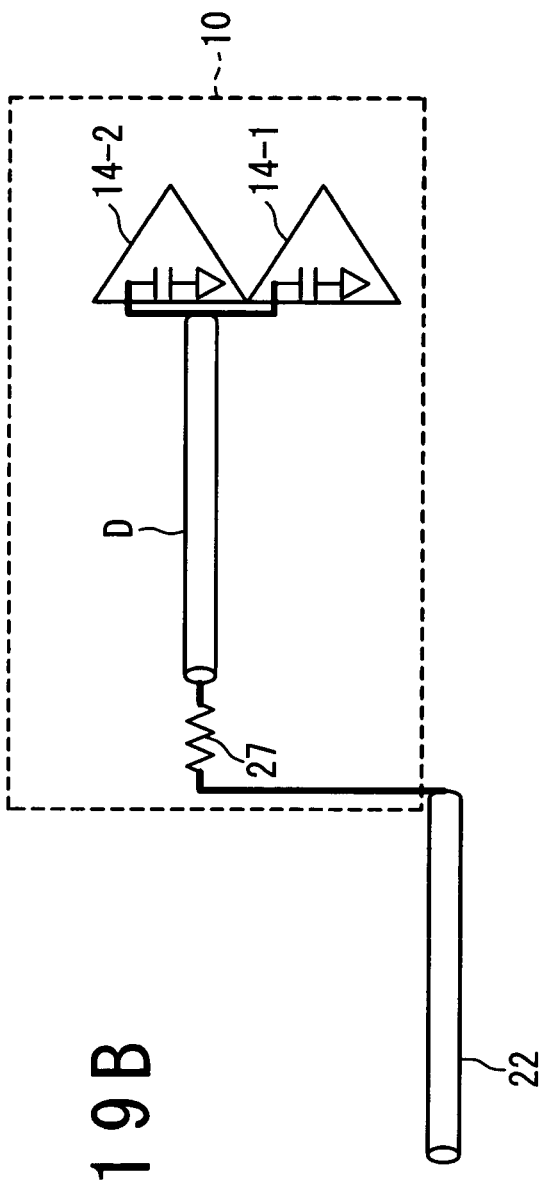
Fig. 19A
Fig. 19B

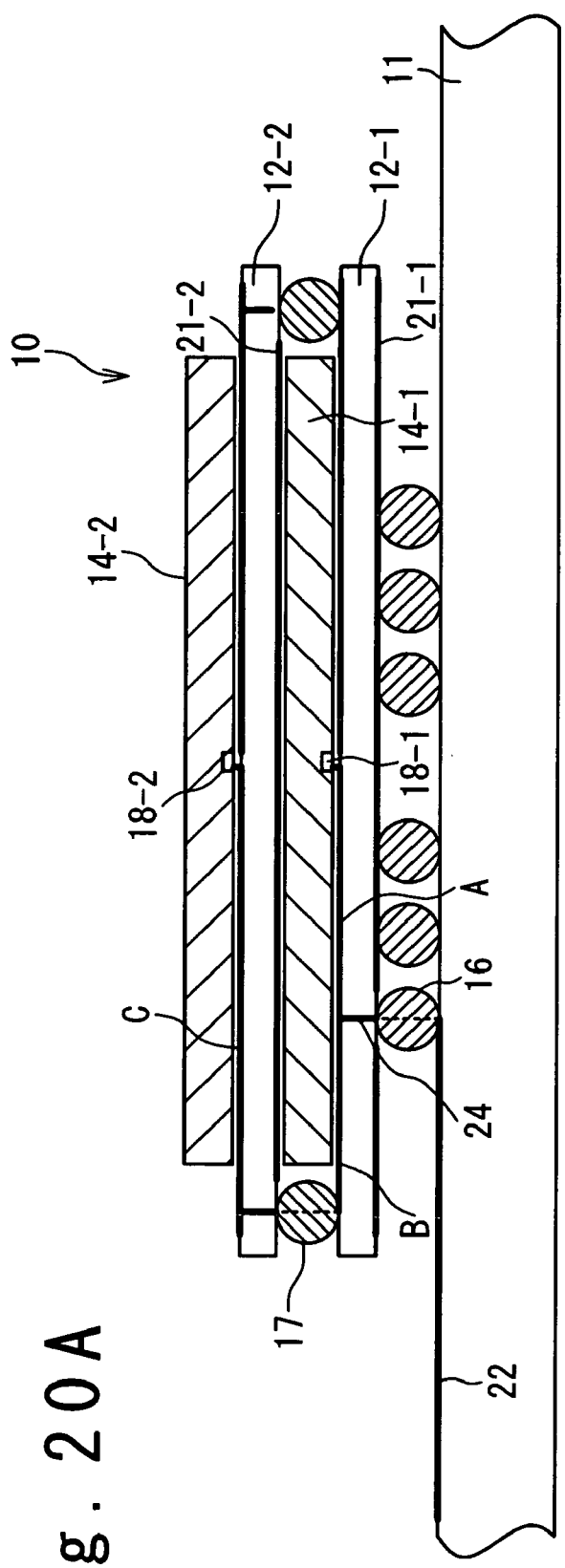
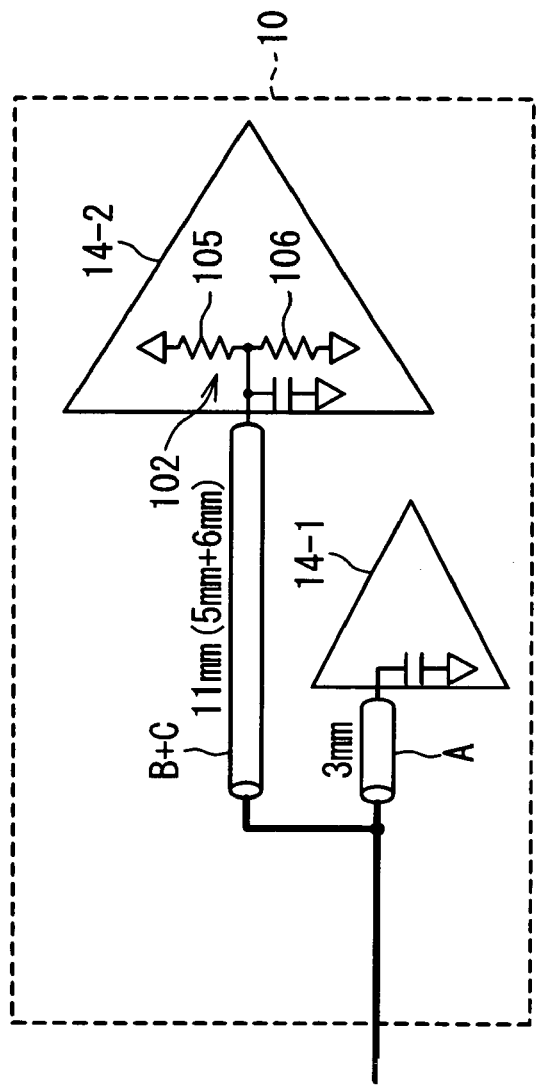
Fig. 20A
Fig. 20B

STACKED SEMICONDUCTOR DEVICE AND SEMICONDUCTOR MEMORY MODULE

BACKGROUND OF THE INVENTION

1. Field of the Invention

The present invention relates to a stacked semiconductor device and a semiconductor device module, particularly to a stacked semiconductor device and a semiconductor memory module used for a high-speed signal transmission system.

2. Description of the Related Art

FIGS. 1A and 1B are diagrams showing a structure of a conventional stacked memory as a stacked semiconductor device. As shown in FIG. 1A, a stacked memory 10 has the structure in which package substrates (tapes) 12 (12-1 and 12-2) mounting memory chips 14 (14-1, 14-2) are stacked through connecting balls 17 arranged at the both sides of the package substrates 12. A lower-stage package substrate 12-1 has a BGA (Ball Grid Array) structure. Moreover, the package substrate 12 has a structure of two metal layers, and a signal wiring has a same structure as a transmission line. A signal wiring 22 on a memory module substrate (PCB) 11 is connected with a signal wiring on the lower-stage package substrate 12-1 through one of the ball terminals 16 and a via-contact 24 and then is divided into signal wirings A and B. The signal wiring A is a wiring having the length of about 3 mm to be connected to the memory chip 14-1 mounted on the lower-stage package substrate 12-1. The signal wiring B is a wiring having the length of about 5 mm to be connected to a signal wiring C of an upper-stage package substrate 12-2 through the connecting ball 17. The signal wiring C is a wiring having the length of about 6 mm to be connected to a chip pad 18-2 of the memory chip 14-2 mounted on the upper-stage package 12-2.

The topology of a signal wiring of the stacked memory 10 is as shown by FIG. 1B. The signal wiring 22 is branched into two wirings in the stacked memory 10. One of the branched wirings is connected to the lower-stage memory chip 14-1 through the short signal wiring A (about 3 mm) and the other branched wiring is connected to the upper-stage memory chip 14-2 through the long signal wiring (about 11 mm) by the signal wirings B and C. That is, the stacked memory 10 has a short wiring of about 3 mm and a long wiring of about 11 mm in the package substrate 12.

FIG. 2 is a diagram showing wiring topology when the conventional stacked memories 10 are used for a high-speed transmission memory module. This is a stroke-book (stubless) wiring topology used for a command address signal and a clock signal. The stacked memories 10 are stublessly connected in the middle of a bus wiring (transmission line) 30 serving as a signal wiring for connecting a controller 31 with a termination circuit 32. However, the signal wiring connected to the upper-stage memory chip 14-2 in the stacked memory 10 forms a long stub (up to 10 mm). Therefore, in case of a high-speed transmission system having a short signal rising time in a rage of 0.3 to 0.5 nanoseconds, ringing occurs due to signal reflection to deteriorate a waveform. Specifically, the stacked memory 10 closest to the controller 31 has a problem that the rising of a waveform is steep, so that large ringing easily occurs to deteriorate the waveform.

Japanese Laid Open Patent Application (JP-P2003-78109A) discloses a technique for a stacked memory device in which a plurality of BGA packages are stacked. The stacked memory device includes a first BGA package and a second BGA package respectively having ball bumps, a first stacking substrate, a second stacking substrate, a connection substrate, and ball bumps. The first stacking substrate includes a wiring pattern connected to the ball bumps of the first BGA package. The second stacking substrate includes a wiring pattern connected to the ball bumps of the second BGA package. The connection substrate is set between the first stacking substrate and the second stacking substrate to connect the wiring patterns contained in each stacking substrate. The ball bumps are provided on the surface opposite to the second BGA package of the second stacking substrate and connected to a pattern contained in the second stacking substrate. Moreover, in case of the stacked memory device, the first stacking substrate is adhered to the upper surface of a resin package contained in the second BGA package.

Furthermore, Japanese Laid Open Patent Application (JP-P2003-124439A) discloses a technique for a BGA stacked semiconductor module. In case of the BGA stacked semiconductor module, a plurality of circuit substrates respectively mounting semiconductor chips are arranged so as to overlap in a predetermined interval and a plurality of connection terminals are formed on the front and back surfaces of the circuit substrate. Each of the connection terminals on the front and back surfaces is made electrically conductive according to necessity, and a connection terminal on the back surface of the circuit substrate is electrically connected with a connection terminal on the front surface of a circuit substrate at the next stage by solder bump. In case of the BGA stacked semiconductor module, some of the connection terminals are improved in reliability by increasing areas of the connection terminals.

Moreover, Japanese Laid Open Patent Application (JP-P2003-273321A) discloses a technique for a semiconductor module in which a plurality of substrate structures are stacked, and semiconductor chips are stacked on the substrate. The semiconductor module has an insulating upper substrate, an insulating lower substrate, a plurality of signal lines, a first common potential wiring, a semiconductor chip, a support substrate, a first connection conductive layer, a second connection conductive layer, a third connection conductive layer, and an external connection terminal. The insulating lower substrate is arranged below the upper substrate. A plurality of signal lines are provided for the upper and lower substrates, respectively. The first common potential wiring is respectively arranged onto the upper and lower substrates to surround the signal lines in an interval. The semiconductor chips are respectively arranged to the upper and lower substrates and have electrode pads electrically connected with the signal lines and the first common potential wiring. The support substrate is provided to the lower portion of the lower substrate and has a wiring pattern formed on a surface opposite to the lower substrate. The first connection conductive layer is arranged between the upper and lower substrates to connect the signal wirings on the upper and lower substrates mutually electrically. The second connection conductive layer is arranged between the upper substrate and the lower substrate to mutually electrically connect the first common potential wirings on the upper and lower substrates. The third connection conductive layer is arranged to pass through the support substrate so as to electrically connect the first and second connection conductive layers. The external connection terminal is arranged on the wiring pattern.

Japanese Laid Open Patent application (JP-A-Heisei 5-55450) discloses a technique for a memory module constituted by stacking a plurality of memory device units. In case of this memory module, a concave portion is formed on the front surface of one side of an insulating substrate. A memory chip is arranged in the concave portion and a plurality of connection terminals are arranged in the peripheral portion of the surface of the insulating substrate. The memory module is constituted by stacking a plurality of memory device units constituted by connecting terminals with electrodes of the memory chip. A power-supply reinforcing capacitor and a termination resistance are built in one of the memory device units.

Moreover, Japanese Laid Open Patent Application (JP-A-Heisei 6-37246) discloses a technique for a configuration in which electrode wirings are formed on an insulating substrate and a plurality of semiconductor devices are mounted. The electrode wirings from a driving semiconductor device to a near passive semiconductor device are provided to have a high resistance and the electrode wirings from the driving semiconductor device to a far passive semiconductor device are provided to have a low resistance.

Furthermore, Japanese Laid Open Patent Application (JP-A-Heisei 8-51127) discloses a technique for a stacked semiconductor package. The stacked semiconductor package is constituted of a semiconductor chip, a plurality of internal leads and a plurality of external leads, an insulating film of a film carrier, a plurality of semiconductor packages, a plurality of frames, and a printing circuit board. The semiconductor chip has a plurality of bonding pads. The bonding pad and the internal lead are electrically connected through a bump on the insulating film of the film carrier to form a semiconductor chip. The semiconductor packages have a forming resin for protecting the semiconductor chip and the internal leads so that the lower surface of the semiconductor chip is exposed. The frames have a circuit pattern to be electrically connected to the external leads of the semiconductor package in order to stack the semiconductor packages. The printing circuit board has a ground land pattern to be electrically connected to the circuit pattern of each frame in common and has a noise preventing capacitor to be mounted on the land pattern under the exposed lower surface of the semiconductor chip. A plurality of conductive films and a plurality of ground terminals are provided in this stacked semiconductor package. The conductive films are formed on the exposed lower surfaces of the semiconductor chips. The ground terminals are electrically connected to the conductive films and electrically connected to the grounding land pattern of the printing circuit substrate in common.

Moreover, Japanese Laid Open Patent Application (JP-A-Heisei 11-260999) discloses a technique for a stacked semiconductor device module. In the stacked semiconductor device module, one or more circuit substrates and at least one circuit substrate are stacked by connecting the substrates by spherical metal connection members. The one or two or more circuit substrates include semiconductor devices on the upper surface or inside and the spherical metal connection members on the lower surface. At least one circuit substrate contains a plurality of passive components on the upper surface and the spherical metal connection member on the lower surface.

SUMMARY OF THE INVENTION

An object of the present invention is to provide a stacked semiconductor device and a semiconductor device module in which a signal waveform is not greatly deteriorated even in a high-speed signal transmission.

In an aspect of the present invention, a semiconductor device module includes a wiring substrate, a plurality of stacked semiconductor devices and a damping impedance circuit. The plurality of stacked semiconductor devices are provided on the wiring substrate and connected with a signal in a stubless manner, and each of the plurality of stacked semiconductor devices comprises a plurality of semiconductor chips which are stacked. The damping impedance circuit is provided for a transmission path of the signal for an uppermost semiconductor chip as the furthest one, from the wiring substrate, of the plurality of semiconductor chips of a first stacked semiconductor device as one of the plurality of stacked semiconductor devices which is first supplied with the signal.

Here, the semiconductor device module may further include a circuit provided on the wiring substrate and configured to output the signal.

Also, each of the plurality of stacked semiconductor devices may be a stacked semiconductor memory, and each of the plurality of semiconductor chips may be a memory chip.

Also, the damping impedance circuit may be a resistance circuit. Instead, the damping impedance circuit may be a capacitor circuit.

Also, the resistance circuit may be provided on the wiring substrate. Instead, the resistance circuit may be provided in the first stacked semiconductor device.

The resistance circuit may be provided in the uppermost semiconductor chip of the first stacked semiconductor device.

The resistance circuit may include first and second resistances connected in series between a higher potential side power supply line and a lower potential side power supply line, and the transmission path of the signal is connected with a connection node between the first resistance and the second resistance.

Also, the resistance circuit may include first and second switches connected with a higher potential side power supply line; third and fourth switches connected with a lower potential side power supply line; first and second resistances connected in series between the first switch and the third switch; and third and fourth resistances connected in series between the second switch and the fourth switch. The transmission path of the signal is connected with a connection node between the first resistance and the second resistance, and a connection node between the third resistance and the fourth resistance, and the first and third switches are turned on in response to a first control signal, and the second and fourth switches are turned on in response to a second control signal.

Also, the damping impedance circuit may include a capacitor between the transmission path of the signal and a lower potential side power supply line. In this case, the capacitor is provided in the uppermost semiconductor chip of the first stacked semiconductor device.

In another aspect of the present invention, a stacked semiconductor device includes a wiring substrate; a plurality of semiconductor chips stacked on the wiring substrate; a damping impedance circuit provided for a transmission path of a signal which is used by an uppermost semiconductor chip of the plurality of semiconductor chips; and a plurality of ball-like connection terminals provided for an underside of the wiring substrate. The signal is connected with each of the plurality of semiconductor chips through a specific one of the plurality of ball-like connection terminals.

Here, the damping impedance circuit may be a resistance circuit. Instead, the damping impedance circuit may be a capacitor circuit.

The lowermost one of the plurality of semiconductor chips may be mounted on the wiring substrate, and the signal may be electrically connected with the plurality of semiconductor chips other than the lowermost semiconductor chip through connection terminals. The resistance circuit is provided for the wiring substrate on a side opposite to the plurality of semiconductor chips. In this case, a first wiring line which connects the signal with the lowermost semiconductor chip is connected with the resistance circuit may be connected with the specific ball-like connection terminal without passing through the resistance circuit. A second wiring line that connects the signal with the uppermost semiconductor chip may be connected with the specific ball-like connection terminal through the resistance circuit.

Also, the stacked semiconductor device may further include a third wiring line that connects the resistance circuit with the specific ball-like connection terminal.

Also, a first wiring line which connects the signal with the lowermost semiconductor chip may be connected with the specific ball-like connection terminal through the resistance circuit, and a second wiring line which connects the signal with the uppermost semiconductor chip may be connected with the specific ball-like connection terminal through the resistance circuit.

Also, the stacked semiconductor device may further including a third wiring line that connects the resistance circuit with the specific ball-like connection terminal.

Also, the resistance circuit may be provided in the uppermost semiconductor chip. In this case, the resistance circuit may include first and second resistances connected in series between a higher potential side power supply line and a lower potential side power supply line. At this time, the transmission path of the signal is connected with a node connection between the first resistance and the second resistance.

The resistance circuit may include first and second switches connected with a higher potential side power supply line; third and fourth switch connected with a lower potential side power supply line; first and second resistances connected in series between the switch and the third switch; and third and fourth resistances connected in series between the second switch and of the fourth switch. The transmission path of the signal may be connected with a connection node between the first resistance and the second resistance, and a connection node between the third resistance and the fourth resistance, and the first and third switches may be turned on in response to a first control signal, and the second and fourth switches may be turned on in response to a second control signal.

Also, the damping impedance circuit may include a capacitor connected between the transmission path of the signal and a lower potential side power supply line. In this case, the capacitor may be provided in the uppermost semiconductor chip.

According to the present invention, it is possible to provide a stacked semiconductor device and a semiconductor memory module capable of reducing ringing due to signal reflection easily generated in a high-speed transmission system and preventing the signal waveform from deteriorating.

BRIEF DESCRIPTION OF THE DRAWINGS

FIGS. 3A and 3B show a configuration of a stacked memory as the stacked semiconductor device used for a memory module as the semiconductor device module according to a first embodiment of the present invention, and a wiring topology;

FIGS. 4A and 4B are diagrams showing the wiring patterns of the lower-stage package substrate 12-1 of the stacked memory in the first embodiment;

FIGS. 5A and 5B are diagrams showing the wiring patterns of the upper-stage package substrate 12-2 of the stacked memory in the first embodiment;

FIG. 7 is a diagram showing a high-speed transmission memory module in the first embodiment;

FIGS. 9A and 9B are diagrams showing simulation waveforms of the uppermost and lowermost memory chips when the stacked memory in the first embodiment is used only for the DRAM 1 among the stacked memories to be mounted and the conventional stacked memories are used for other stacked memories;

FIGS. 11A and 11B show a configuration of the stacked semiconductor device according to a second embodiment of the present invention;

FIGS. 15A and 15B show a configuration of the stacked memory as the stacked semiconductor device according to a third embodiment of the present invention, and a wiring topology thereof;

FIGS. 17A to 17C show a configuration of the stacked memory as the stacked semiconductor device according to a fifth embodiment of the present invention, a wiring topology thereof, and a resistor;

FIGS. 18A and 18B show a configuration of the stacked memory as the stacked semiconductor device according to a sixth embodiment of the present invention, and a wiring topology thereof;

FIGS. 19 A and 19B show a configuration of the stacked memory as the stacked semiconductor device according to a seventh embodiment of the present invention, and a wiring topology thereof;

FIGS. 20A and 20B are diagrams showing a configuration of the stacked memory as the stacked semiconductor device according to an eighth embodiment of the present invention, and a wiring topology thereof;

DESCRIPTION OF THE PREFERRED EMBODIMENTS

Figure 1A:
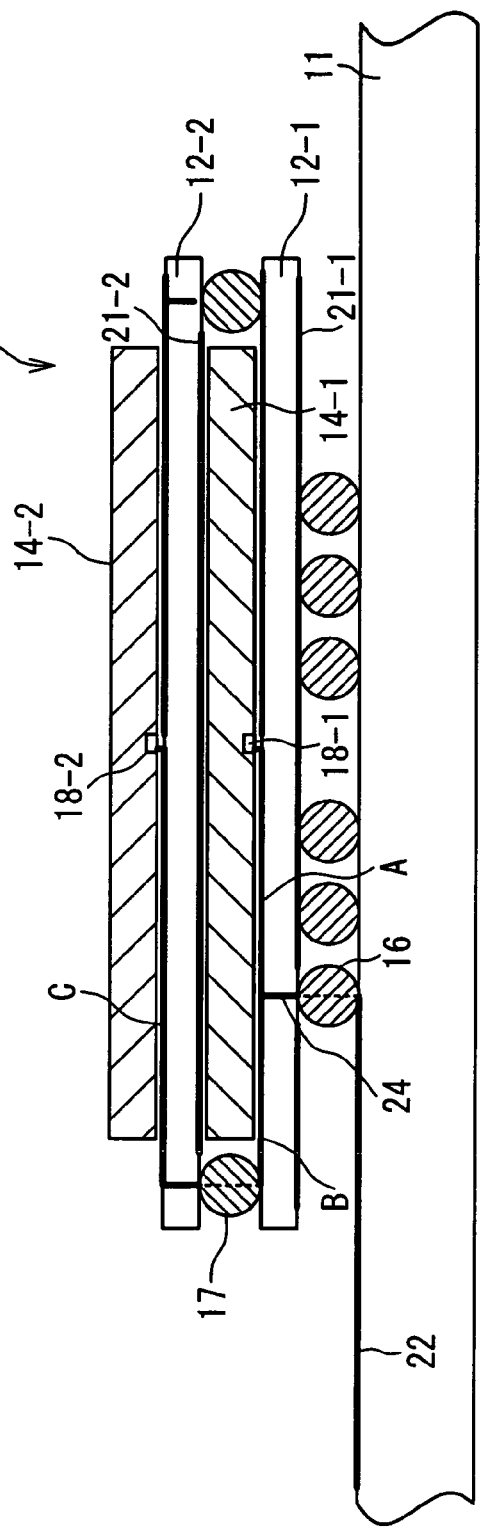
FIGS. 1A and 1B are diagrams showing a structure of a conventional stacked memory as a stacked semiconductor device, and a wiring topology.
Figure 1B:
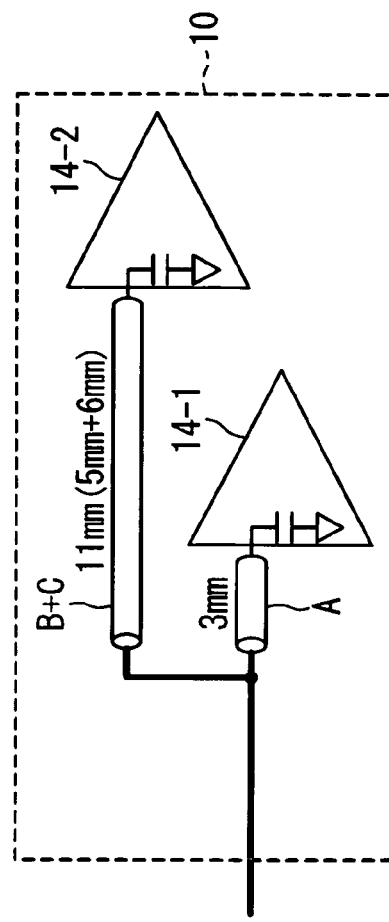
Figure 2:
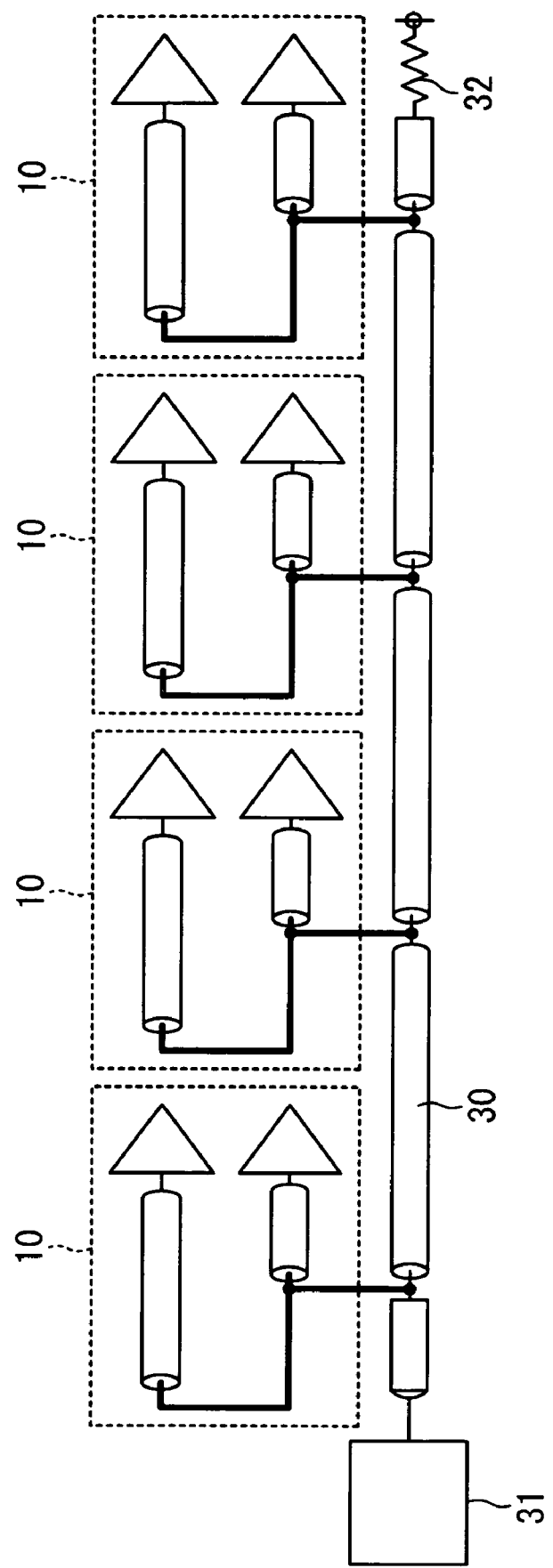
FIG. 2 is a diagram showing wiring topology when the conventional stacked memories are used for a high-speed transmission memory module.

Hereinafter, a semiconductor device module using stacked semiconductor devices according to the present invention will be described in detail with reference to the attached drawings.

FIGS. 3A and 3B show a configuration of a stacked memory as the stacked semiconductor device used for a memory module as the semiconductor device module according to the first embodiment of the present invention. As shown in FIG. 3A, the stacked memory 10 is mounted on a memory module substrate (PCB) 11 through package terminals as ball terminals 16 of a BGA (Ball Grid Array) structure. Thus, the stacked memory 10 is connected with the memory module substrate 11 are connected by the package terminals 16. In case of the stacked memory 10, a package substrate 12-2 for mounting the memory chip 14-2 is stacked on the package substrate 12-1 for mounting the memory chip 14-1. The package substrate 12-1 is electrically connected with the memory chip 14-1, and the package substrate 12-2 is electrically connected with the memory chip 14-2. Each of the package substrates 12-1 and 12-2 has a 2-layer metal structure in which an insulating layer is put between metal layers. The surface wiring patterns of the package substrates 12-1 and 12-2 will be described later. The package substrates 12-1 and 12-2 are electrically connected with each other through connection solder balls 17 provided for their end portions. In this example, the package substrates 12-1 and 12-2 are electrically connected through the connection solder balls 17, another method may be adopted if they can be electrically connected.

FIGS. 4A and 4B are diagrams showing the wiring patterns of the lower-stage package substrate 12-1 of the stacked memory 10. FIG. 4A shows the wiring pattern of an upper side signal layer, and FIG. 4B shows the wiring pattern of a lower side ground layer of the package substrate 12-1.

As shown in FIG. 4A, the signal layer of the package substrate 12-1 has a wiring area 34 shown by a dashed line and the other area. The connection balls 17 are arranged in a line in end portions of the signal layer of the package substrate 12-1 so as to be connected with the package substrate 12-2. A part of the connection balls 17 is contained in the wiring area 34. A command address signal or clock signal that is preferably a stroke-book wired, i.e., is wired in a stubless manner is arranged in the wiring area 34. Here, the stubless wiring means is not a wiring in which there is no stub, but a wiring in which there is no stub other than small stubs to be described later.

In the wiring area 34, a signal wiring A is arranged from a via-contact to be connected to the ball terminal 16 to the chip pad 18-1 of the memory chip 14-1. Also, a signal wiring B is arranged from the via-contact 24 to be connected to a resistor 27 to the connection ball 17. Moreover, signal lines such as data signal lines that may not be wired in a stubless manner are arranged in the area other than the wiring area 34.

As shown in FIG. 4B, a ground pattern 38 is spread on almost the entire surface of the ground layer of the package substrate 12-1. Thus, the signal characteristic is stabilized. Necessary wirings are arranged in an opening 35 corresponding to the wiring area 34 of the signal layer. The ball terminals 16 and the resistor 27 are arranged on the ground layer. One of the ball terminals 16 is connected to the signal layer through the via-contact 24 and is connected to a lead wiring 37 reaching one end of the resistor 27. The other end of the resistor 27 is connected to the signal layer through the via-contact 24.

Thus, the ball terminal 16 is connected to one terminal of the resistor 27 by the lead wiring 37 and the other terminal of the resistor 27 is connected to the signal wiring B in the signal layer of the package substrate 12-1 through the via-contact 24. The signal wiring A is connected to the ball terminal 16 and one 18-1 of linear chip pads (electrodes) 18 of the lower-stage memory chip 14. Thus, a signal is supplied from the memory module substrate 11 to the memory chip 14.

FIGS. 5A and 5B are diagrams showing the wiring patterns of the upper-stage package substrate 12-2 of the stacked memory 10. FIG. 5A shows the wring pattern of the signal layer of the package substrate 12-2. FIG. 5B shows the wiring pattern of the ground layer of the package substrate 12-2.

As shown in FIG. 5A, the signal layer of the package substrate 12-2 has a wiring area 34' corresponding to the area 34 of the package substrate 12-1 and the other area. A signal wiring C is arranged in the wiring area 34' of the signal layer of the package substrate 12-2 to connect the via-contact connected to the connection ball 17 with the chip pad 18-2. The signal wiring C is a wiring for a command address signal or a clock signal that will preferably be wired in a stubless manner. Moreover, the data signal wirings 36 are arranged in the area other than the area 34' to transfer a data signal.

As shown in FIG. 5B, the ground layer of the package substrate 12-2 is formed almost entirely as a ground plane 38 except the opening 35 in the periphery of the connection balls 17 and the chip pads 18-2.

As described above, the resistor 27 is mounted on the ground layer of the package substrate 12-1. The resistor 27 is a chip resistor having the resistance value in a range of 20 to 50 Ω and is arranged in the vicinity of the ball terminals (package terminals) 16. Moreover, the size of the package substrate 12 is not increased.

A signal wiring 22 arranged on the memory module substrate 11 is connected to the package substrate 12-1 through one of the ball terminals 16 serving as the package terminals having the BGA structure. The ball terminal 16 is connected to the chip pad 18-1 of the memory chip 14-1 to be mounted on the package substrate 12-1 through the short signal wiring A. Also, the ball terminal 16 is connected to the memory chip 14-2 on the package substrate 12-2. The ball terminal 16 is first connected to the signal wiring B on the package substrate 12-1 through the resistor 27. The signal wiring B is connected to the signal wiring C on the package substrate 12-2 through the connection ball 17. The signal wiring C is connected the chip pad 18-2 of the memory chip 14-2.

The topology of signal wirings is shown in FIG. 3B. The signal wiring 22 on the memory module substrate 11 is branched to two wirings in the stacked memory 10. One of the branched wirings is connected to the memory chip 14-1 via the signal wiring A having the length of 3 mm. The other of them is connected to the resistor 27. The other end of the resistor 27 is connected to the memory chip 14-2 through the signal wiring B having the length of 5 mm and the signal wiring C having the length of 6 mm. Therefore, the signal line 22 is connected to the memory chip 14-2 through the signal wiring having the total length of 11 mm.

Figure 6:
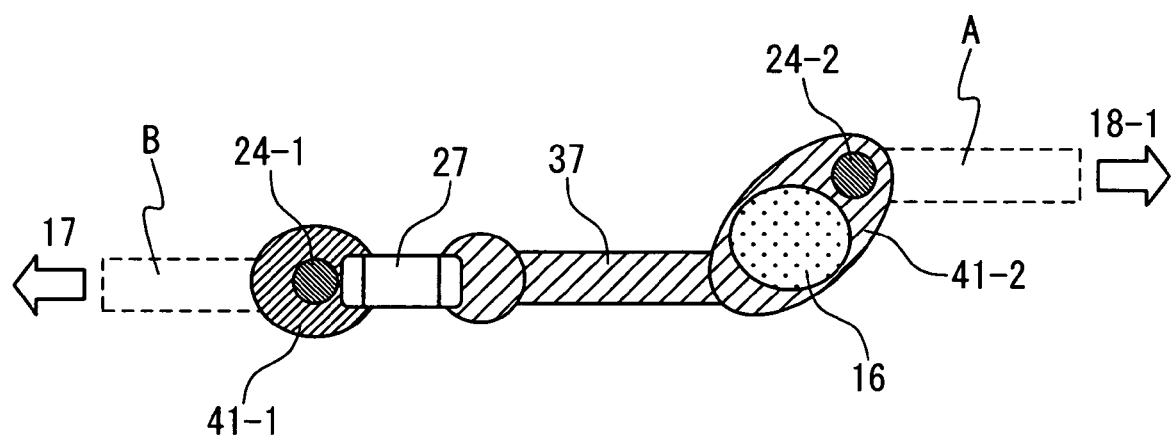
FIG. 6 is a diagram showing a part of wiring pattern of the lower-stage stacked memory in the first embodiment.

FIG. 6 is an diagram showing a wiring pattern between the ball terminal 16 of the lower-stage package substrate 12-1, the resistor 27, the signal wiring A, and the signal wiring B in the stacked memory 10. The ball terminal 16 and the resistor 27 are arranged on the ground layer of the package substrate 12-1. The signal wirings A and B are arranged on the signal layer. Therefore, the ball terminal 16 and the resistor 27 are connected to the signal wirings A and B through the via-contact 24-1 and 24-2, respectively. That is, the ball terminal 16 is arranged on a land 41-2 in the package substrate 12-1 and connected to the signal wiring 22. The land 41-2 is connected to the signal wiring A through the via-contact 24-2. The signal wiring A is connected to the chip pad 18-1. Also, the land 41-2 is connected to one end of the resistor 27 by the lead wiring 37. The other end of the resistor 27 is connected to the land 41-1. The land 41-1 is connected to the signal line B of the signal layer through the via-contact 24-1. The signal wiring B is connected to the connection ball 17. In this case, the ball terminal 16 has the dimension of the diameter of about 0.45 mm. When the resistor 27 is of a 0603 type, it has dimensions of about $0.6 \times 0.3 \times 0.23$ mm$^3$. Thus, the resistor has almost the same dimension as the ball terminal. Therefore, if the resistor with such dimensions is used, the package substrate is not required to be increased.

Next, a case where the stacked memories 10 are used for the memory module with the stubless wiring will be described below.

FIG. 7 shows an example when the stacked memories 10 are applied to a high-speed transmission memory module. In the memory module, not only the stacked memories 10 but also a controller 31 and a termination circuit 32 are mounted on the memory module substrate 11. In this example, the controller 31 is mounted on the memory module substrate 11, but a signal may be supplied from an external portion. In the example shown in FIG. 7, four stacked memories 10 are mounted on the front surface of the memory module substrate 11 and five stacked memories 10 are mounted on the back surface of the memory module substrate 11. The nearest stacked memory 10 to the controller 31 is arranged as a DRAM1 on the back surface of the memory module substrate 11 corresponding to the controller 31. A DRAM2, DRAM3, DRAM4 and DRAM5, which is closest to the termination circuit 32, are arranged in order on the both sides of the memory module substrate 11. A wiring length TL2 between the adjacent stacked memories 10 (for example, between DRAM2 and DRAM3) is 14 mm. Also, the wiring length TL0 between the controller 31 and a via-contact 25 is 2 mm. The wiring length TL1 between the stacked memory 10 and the via-contact 25 is 3 mm, and the wiring length TL3 between the via-contact 25 and the termination circuit 32 is 15 mm. The characteristic impedance Zo of these wirings is 65 Ω. The termination circuit 32 is composed of a resistor RT of 25 Ω and is connected to a terminal voltage VTT (0.9 V). The controller 31 has an output circuit having the output resistance of 18 Ω and the output capacity of 2.0 pF, and rising/falling time (tr/tf) is 0.3 nsec, which a pulse having the amplitude of 1.8 V is sent out in the rate of 400 Mb/sec.

Figure 8A:
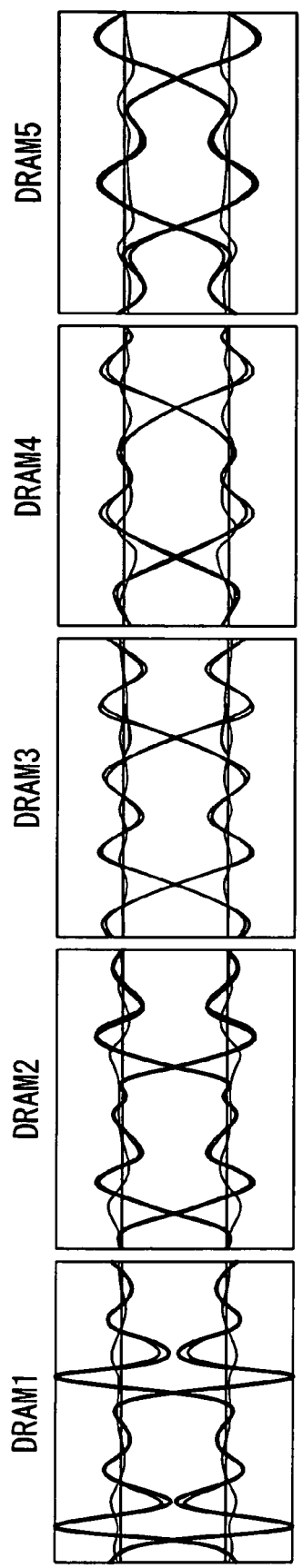
FIGS. 8A and 8B are diagrams showing simulation waveforms of the uppermost and lowermost memory chips when conventional stacked memories are used for the stacked memories to be mounted for the high-speed transmission memory module shown in FIG. 7.
Figure 8B:
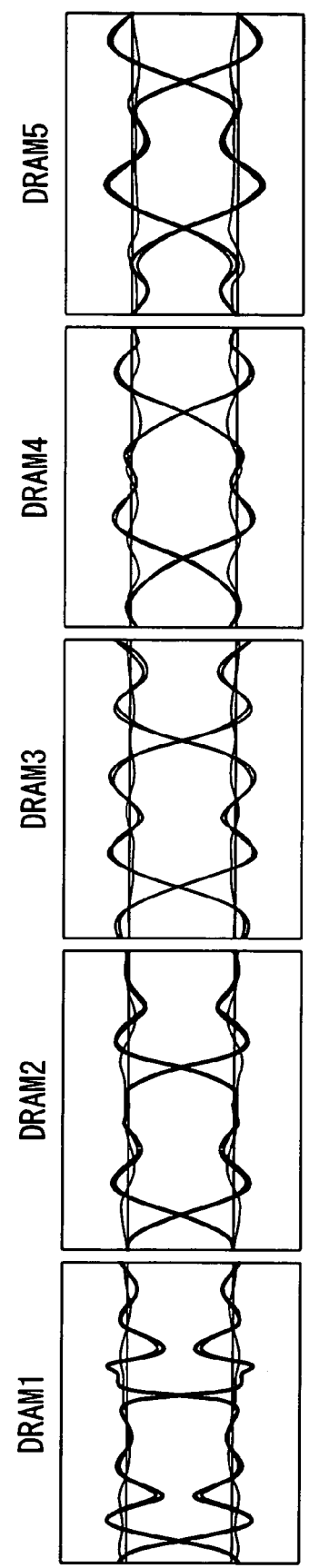

FIGS. 8A and 8B are diagrams showing simulation waveforms when conventional stacked memories are used as the stacked memories to be mounted on the high-speed transmission memory module shown in FIG. 7. FIG. 8A shows waveforms of the uppermost memory chips 14-2 of the stacked memories 10 and FIG. 8B shows waveforms of the lowermost memory chips 14-1. Large ringing (overshoot) could be observed especially in the DRAM 1.

FIGS. 9A and 9B are diagrams showing simulation waveforms when the stacked memory 10 of the present invention is used only for the DRAM 1 among the stacked memories to be mounted and the conventional stacked memories are used for other stacked memories. FIG. 9A is a diagram showing waveforms of the uppermost memory chips 14-2 and FIG. 9B is a diagram showing waveforms of the lowermost memory chips 14-1. It could be found that the large ringing disappears from the DRAM 1 and the waveforms are improved in all the memory chips 14, compared with a case shown in FIGS. 8A and 8B.

Figure 10A:
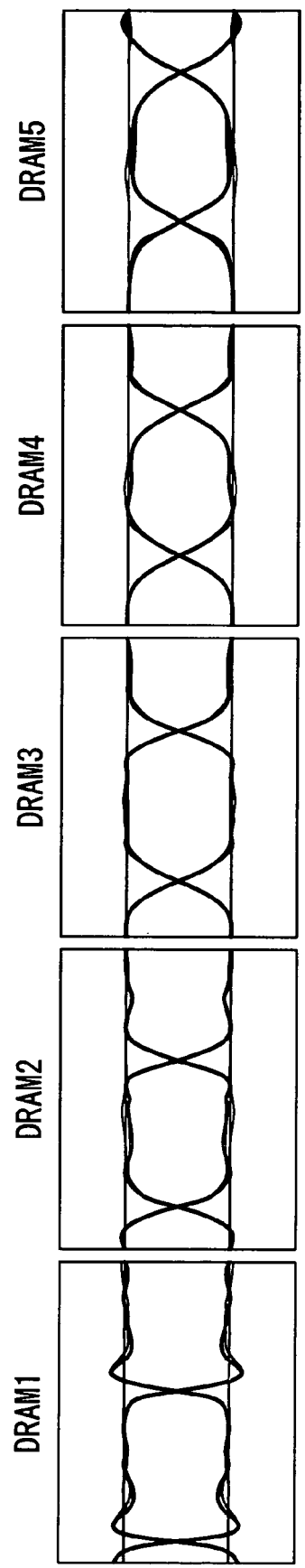
FIGS. 10A and 10B are diagrams showing simulation waveforms of the uppermost and lowermost memory chips when the stacked memories in the first embodiment are used for all the stacked memories to be mounted for the high-speed transmission memory module shown in FIG. 7.
Figure 10B:
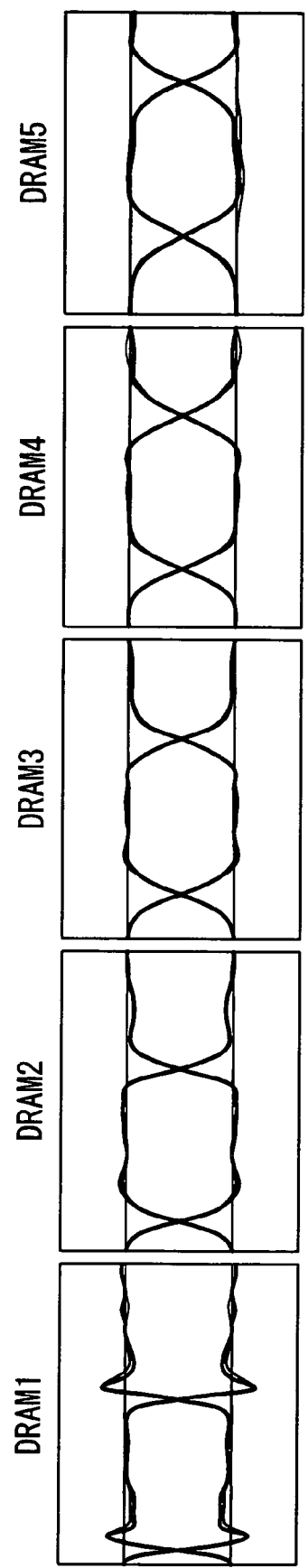

FIGS. 10A and 10B are diagrams showing simulation waveforms when the stacked memories 10 of the present invention are used for all the stacked memories to be mounted in the high-speed memory module shown in FIG. 7. FIG. 10A is a diagram showing waveforms of the uppermost memory chips 14-2 of the stacked memories 10, and FIG. 10B is a diagram showing waveforms of the lowermost memory chips 14-1. It could be found that the waveforms are improved in all the memory chips 14.

In this way, in the stacked memory 10 of the high-speed transmission memory module, when the present invention is applied to the stubless topology wiring for a command address signal or a clock signal, the resistor 27 which is arranged so as to connected to the signal wiring B restrains ringing and deterioration of the signal waveform is prevented. That is, when the stubless topology wiring is applied to the command address signal of the stacked memory, a signal wiring to be connected to the uppermost memory chip forms a long stub and a signal wiring to be connected to a lowermost memory chip forms a short stub on the package substrate. According to the present invention, a resistor is arranged in a position near to the root of the stub and functions as a damping resistance to restrain current and decrease signal reflection. Therefore, it is possible to restrain ringing. Specifically, in case of the stacked memory closest to a controller, rise of a waveform is steep and large ringing easily occurs. Therefore, when the resistance 27 is used, an effect remarkably appears. In this case, even if the resistor 27 is provided for the signal wiring B, the length of the signal wiring A is never elongated.

Moreover, by mounting the resistance on the package substrate, it is unnecessary to arrange the resistor on the memory module substrate. Therefore, it is possible to keep design compatibility with a memory module for a planar package which is not of the stacked type but a standard planar package. Therefore, there is also an advantage that the versatility of wiring on the memory module substrate is not lost.

It should be noted that the effect of the stubless wiring has been mainly described above. However, it is needless to say that there is also an effect in a point-to-point wiring.

Also, in the above example, a case where there are two memory chips in the stacked memory has been described. However, the present invention is applicable to a stacked memory having three or more memory chips. In this case, the memory chip 14-1 is the lowermost chip and the memory chip 14-2 is the uppermost chip. The memory chips between the uppermost chip and the lowermost chip are provided with damping resistances (impedances) as in the uppermost chip, if necessary. This is applicable to the following embodiments.

FIGS. 11A and 11B show a configuration of the stacked memory mounted on the memory module according to the second embodiment of the present invention. As shown in FIG. 11A, the stacked memory 10 is arranged on the memory module substrate 11. It should be noted that the same reference numerals as in the first embodiment are allocated to the same components as in the first embodiment. This is applied to the following embodiments.

In the stacked memory 10 of the second embodiment, the package substrate 12-2 for mounting the memory chip 14-2 is stacked on the package substrate 12-1 for mounting the memory chip 14-1. The package substrates 12-1 and 12-2 are connected to each other through the connection balls 17 arranged their right and left ends. The lowermost package substrate 12-1 has the package terminals 16 of the BGA structure and is connected to the memory module substrate 11. In this case, the substrates 12-1 and 12-2 are connected through the connection balls 17. However, another method may be employed in which these substrate 12-1 and 12-2 are electrically connected.

The package substrate 12 has the two-layer metal structure and the signal wiring has a transmission line structure by using the ground layer. Portions other than signal wirings and openings are covered with the ground layer 21 on the lower surface of the package substrate 12, so that a signal characteristic is stabilized. Signal lines on the lower and upper surfaces of the package substrate 12 are connected by the via-contacts 24. A wring in the signal layer on the package substrate 12 is connected to the chip pad (electrode) 18 of the memory chip 14 to supply a signal to the memory chip 14. Moreover, the resistor 27 is mounted on the package substrate 12-1. The resistor 27 is the chip resistor having the resistance value in a range of 20 to 50 Ω, and is arranged on the surface of the package substrate 12-1 opposite to the memory chip 14-1. Thus, the resistor 27 is possible to be arranged nearby the ball terminals (package terminals) 16 but the size of the package substrate 12 is not increased.

The signal wiring 22 arranged on the memory module substrate 11 is connected to the lower side signal wiring of the package substrate 12-1 through one of the ball terminals 16. The lower side signal wiring is connected to one end of the resistor 27. The other end of the resistor 27 is arranged on a land including the via-contact 24 and connected to the signal wirings A and B on the upper surface of the package substrate 12-1 through the via-contact 24. The signal wiring A is connected to the chip pad 18-1 of the memory chip 14-1. The signal wiring B is connected to land of the uppermost package substrate 12-2 through the connection ball 17, and connected to the signal wiring C on the upper surface of the package substrate 12-2 through a via-contact connected to the land. The signal wiring C is connected from the via-contact to the chip pad 18-2 of the memory chip 14-2.

The topology of the signal wiring is as shown in FIG. 11B. The signal wiring 22 is connected to the resistor 27 of the stacked memory 10. The resistor 27 is a chip resistance having the resistance of about 20 Ω. The wiring is branched into two wirings at the other end of the resistor 27. One of them is connected to the memory chip 14-1 via the signal wiring A having the length of 6 mm. The other of them is connected to the memory chip 14-2 via the signal wiring B having the length of 5 mm and the signal wiring C having the length of 6 mm. Therefore, this path is connected to the memory chip 14-2 through the signal wiring having the total length of 11 mm. By arranging the wiring as described above, the resistor 27 provides an effect to a long stub of the signal wirings B and C and a short stub by the signal wiring A.

Figure 12:
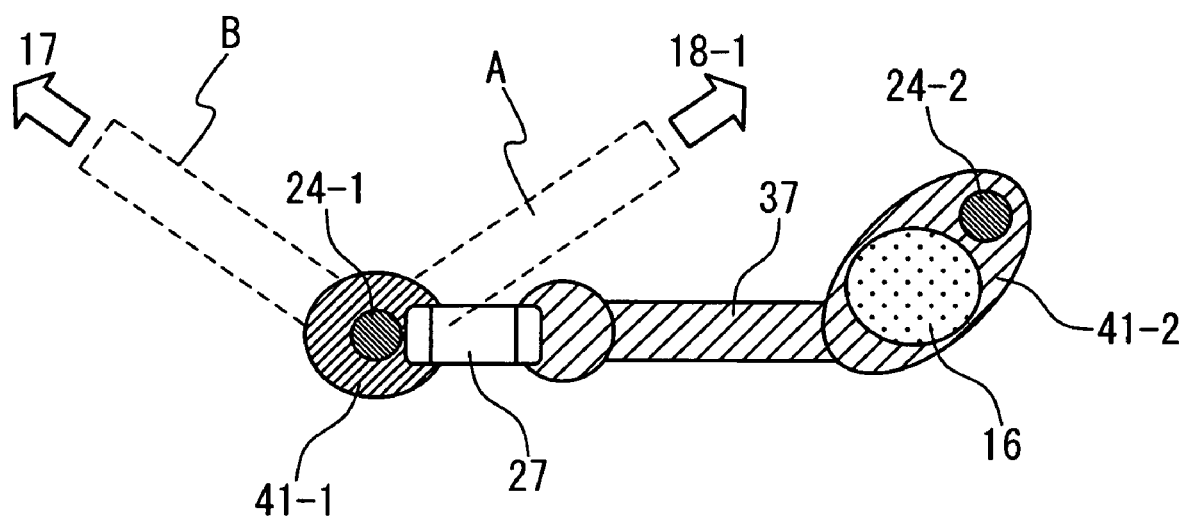
FIG. 12 is a diagram showing a part of wiring pattern of the lower-stage package substrate of the stacked memory in the second embodiment.

FIG. 12 is a diagram showing a wiring pattern for connection between the ball terminal 16 of the lower-stage package substrate 12-1 of the stacked memory 10, the resistor 27, the signal wiring A, and the signal wiring B. The ball terminal 16 and the resistor 27 are arranged on the ground layer of the package substrate 12-1. The signal wirings A and B are arranged to the signal layer. Therefore, the ball terminal 16 and resistor 27 are connected with the signal wirings A and B by the via-contact 24-1. On the ground layer, the ball terminal 16 is arranged on the land 41-2 and connected to the signal wiring 22. The lead wiring 37 is arranged to a land, to which one end of the resistor 27 is connected, from the land 41-2. The land 41-1 is arranged in a position to which the other end of the resistor 27 is connected. The land 41-1 includes the via-contact 24 in its region and is connected to the signal wirings A and B of the signal layer. The signal wiring A is connected to the chip pad 18-1 on the signal layer. The signal wiring B is connected to the connection ball 17 to be connected to the upper-stage package substrate 12-2 on the signal layer. The resistor 27 is a 0603-type chip resistance similarly to the first embodiment. Therefore, the size of the resistor is almost the same as the size of the terminal ball 16 but the package substrate size is not increased by arranging the resistor.

Figure 13A:
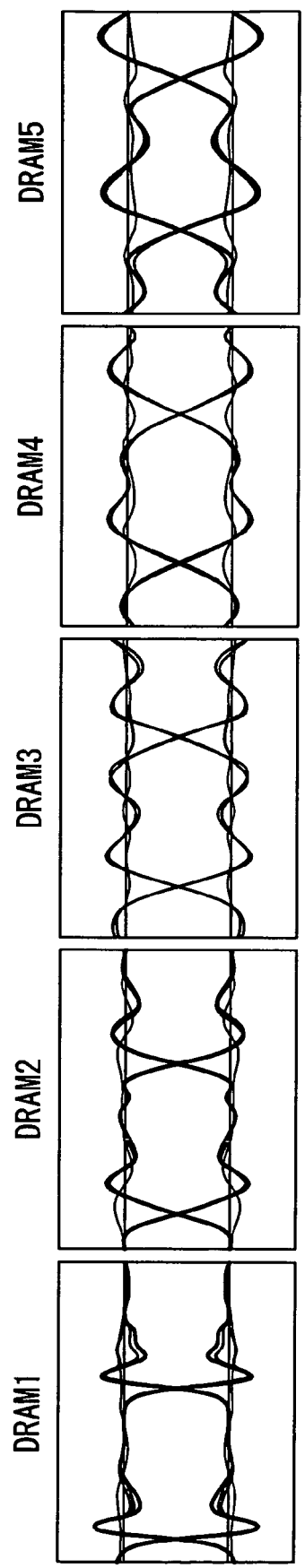
FIGS. 13A and 13B are diagrams showing simulation waveforms of the uppermost and lowermost memory chips when the stacked memory in the second embodiment is only as the DRAM1 closest to a controller 31 and the conventional stacked memories are used as other stacked memories.
Figure 13B:
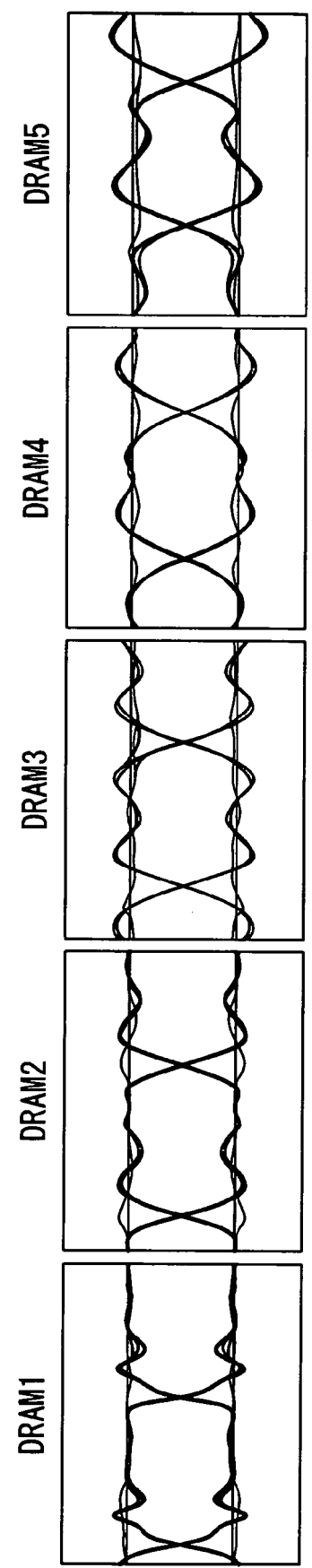

FIGS. 13A and 13B and FIGS. 14A and 14B are diagrams showing simulation waveforms when the stacked memories are applied to the memory module as shown in FIG. 7 similarly to the first embodiment. FIGS. 13A and 13B are diagrams showing simulation waveforms when the stacked memory 10 of the present invention is only as the DRAM1 closest to a controller 31 and the conventional stacked memories are used as other stacked memories. FIG. 13A is a diagram showing waveforms of the uppermost memory chips 14-2 and FIG. 13B is a diagram showing waveforms of the lowermost memory chips 14-1. It could be found that large ringing is eliminated from the DRAM 1 and waveforms are improved in all the memory chips 14.

Figure 14A:
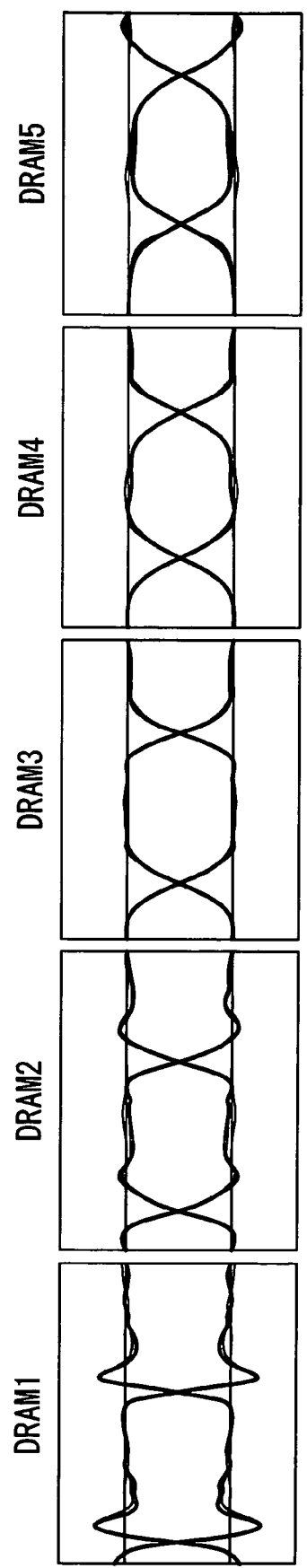
FIGS. 14A and 14B are diagrams showing simulation waveforms of the uppermost and lowermost memory chips when the stacked memories in the second embodiment are used as all the stacked memories.
Figure 14B:
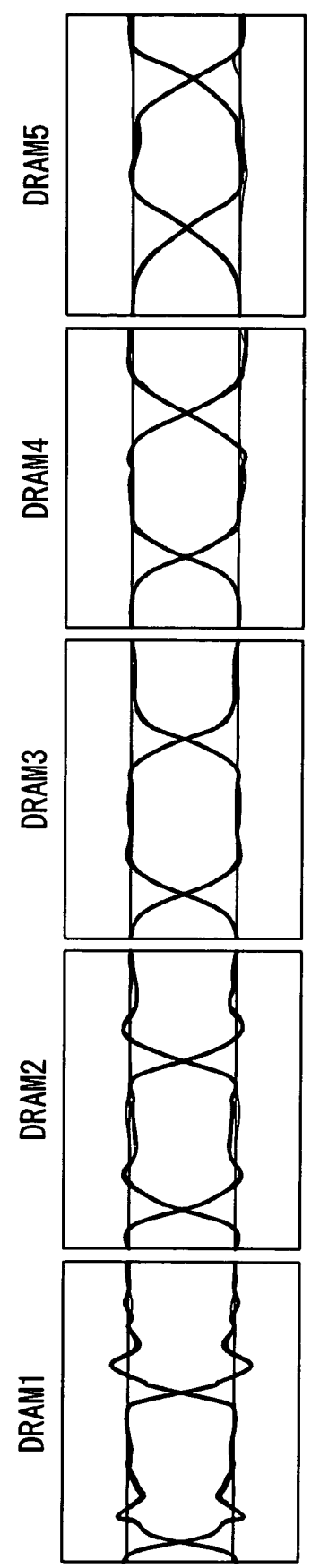

FIGS. 14A and 14B are diagrams showing simulation waveforms when the stacked memories 10 of the present invention are used as all the stacked memories 10. FIG. 14A is a diagram showing waveforms of the uppermost memory chips 14-2 of the stacked memories 10 and FIG. 14B is a diagram showing waveforms of the lowermost memory chips 14-1 thereof. It could be found that waveforms are improved in all the memory chips 14.

Thus, when the stubless topology wiring of the present invention is applied to a command address signal wiring or a clock signal wiring of the stacked memory 10 of the high-speed transmission memory module, the ringing is restrained by the resistor 27 and the deterioration of the signal waveform is prevented. That is, when the stubless topology wiring is applied to the command address signal wiring of the stacked memory, the signal wiring to be connected to an uppermost memory chip forms a long stub and the signal wiring to be connected to the lowermost memory chip forms a short stub in the package substrate. According to the present invention, the resistor is arranged nearby the root of each of the stubs and functions as a damping resistance to restrain current, and to decrease signal reflection. Therefore, it is possible to restrain ringing. Particularly, in case of the stacked memory closest to the controller 31, rise of a waveform is steep and ringing easily occurs. Therefore, when the resistor is used for the stacked memory closest to the controller 31, an effect remarkably appears.

Moreover, by mounting the resistor on the package substrate, it is unnecessary to arrange the resistor on the memory module substrate 11. Therefore, it is possible to keep design compatibility with the memory module for a planar package which is not of the stacked type but a standard horizontal package. Thus, there is also an advantage that the versatility of the wiring on a module substrate is not lost.

It should be noted that it is needless to say that the above effect is also achieved in a point-to-point wiring although the above description has been made mainly to the stubless wiring.

FIGS. 15A and 15B show a configuration of the stacked memory 10 mounted on the memory module according to the third embodiment of the present invention. As shown in FIG. 15A, the stacked memory 10 is arranged on the memory module substrate 11 and a wiring in the stacked memory 10 and the signal wiring 22 on the memory module substrate 11 are connected by the ball terminal 16. The ball terminal 16 is of the BGA type.

In the stacked memory 10, the package substrate 12-1 for mounting the memory chip 14-2 is stacked on the package substrate 12-1 for mounting the memory chip 14-1. The package substrate 12-1 and 12-2 are connected by the connection balls 17 which are arranged at the right and left sides the substrates. The lower-stage package substrate 12-1 has the package terminals 16 of the BGA type which are connected to the signal lines on the memory module substrate 11. In this case, substrates 12-1 and 12-2 are connected through the connection balls 17. However, another method may be used as long as the substrates are mutually electrically connected.

In the lower side surface of the package substrate 12, a portion other than signal wirings and openings is covered with the ground layer 21. The signal wirings on the lower side and upper side surfaces of the package substrate 12 (12-1 or 12-2) are connected by the via-contacts 24. A signal wiring in the signal layer of the package substrate 12 is connected to the chip pad 18 of the memory chip 14 to supply a signal to the memory chip 14. Moreover, the resistor 27 is mounted on the lower side surface of the package substrate 12-1. The resistor 27 is a chip resistance having a resistance value in a range of 20 to 500 $\Omega$ and is arranged to the lower side surface of the package substrate 12-1 opposite to the memory chip 14-1. Thus, the resistor 27 can be arranged nearby the ball terminal (package terminal) 16 and the size of the package substrate 12 is not increased.

The signal wiring 22 on the memory module substrate 11 is connected to the package substrate 12-1 through the ball terminal 16 serving as a package terminal having the BGA structure. The ball terminal 16 is connected to one end of the resistor 27 by the signal line B at the lower side surface of the package substrate 12-1 on which the ground layer 21-1 is formed. Also, the ball terminal 16 is connected to the signal wiring A arranged on the upper side surface of the package substrate 12-1 by the via-contact nearby the ball terminal 16. The signal wiring A is connected to the chip pad 18-1 of the memory chip 14-1. The other end of the resistor 27 is connected to a land including the via-contact 24 and connected to the connection ball 17 on the upper side surface of the package substrate 12-1 through the via-contact 24. The wiring C in the signal layer of the package substrate 12-2 is connected to the connection ball 17 through the via-contact and connected to the chip pad 18-2 of the memory chip 14-2. In this embodiment, the resistor 27 is arranged to overlap with the connection ball 17. Therefore, any extra area is not required.

The topology of the signal wiring is as shown in FIG. 15B. The signal wiring 22 is connected to the stacked memory 10 and branched into two wirings. One of them is connected to the memory chip 14-1 by the signal wiring A having the length of 3 mm. The other of them is connected to the resistor 27 by the signal wiring B having the length of 5 mm. The resistor 27 is a chip resistance having a resistance value of about 20 $\Omega$. The other end of the resistor 27 is connected to the memory chip 14-2 through the signal wiring C having the length of 6 mm.

As described above, the resistor 27 is arranged on the lower side surface of the lower-stage package substrate 12-1 opposite to the connection ball 17. Thereby, even when the memory chip 14 is decreased in size, it is possible to arrange the resistor 27 without taking an occupying area on the package substrate 12 and decreasing the stacked memory 10 in size.

Figure 16A:
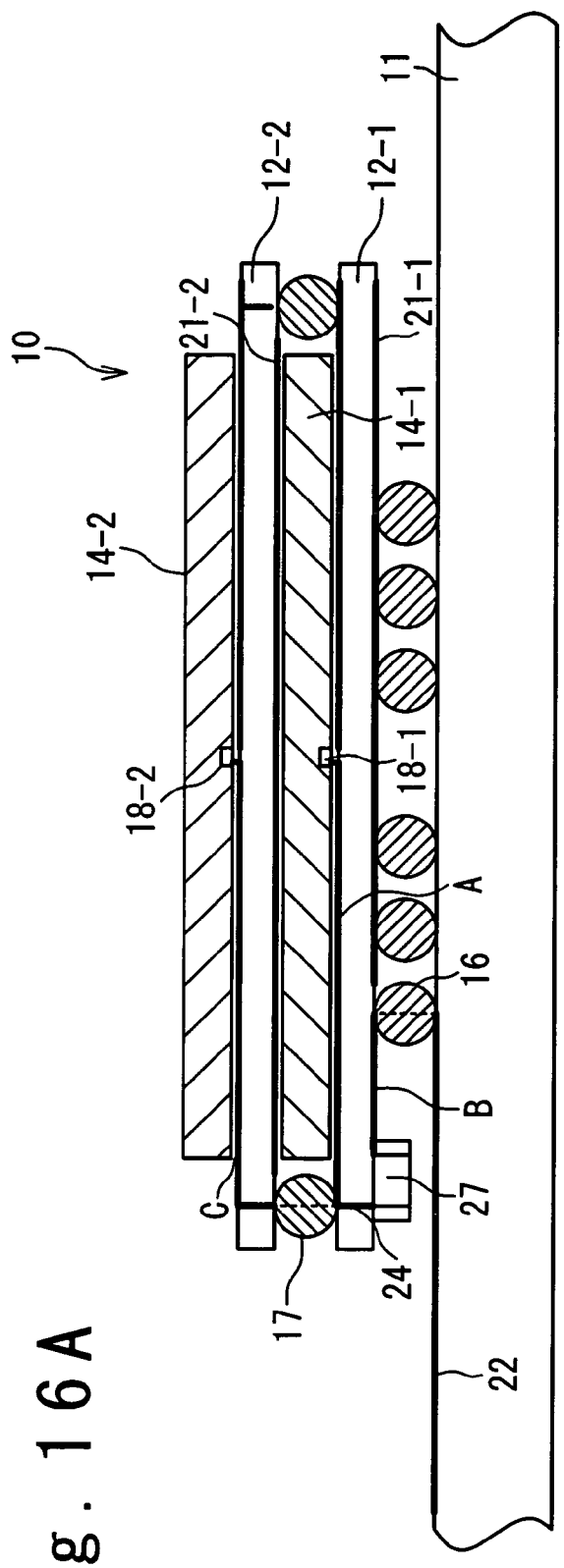
FIGS. 16A and 16B show a configuration of the stacked memory as the stacked semiconductor device according to a fourth embodiment of the present invention, and a wiring topology thereof.
Figure 16B:
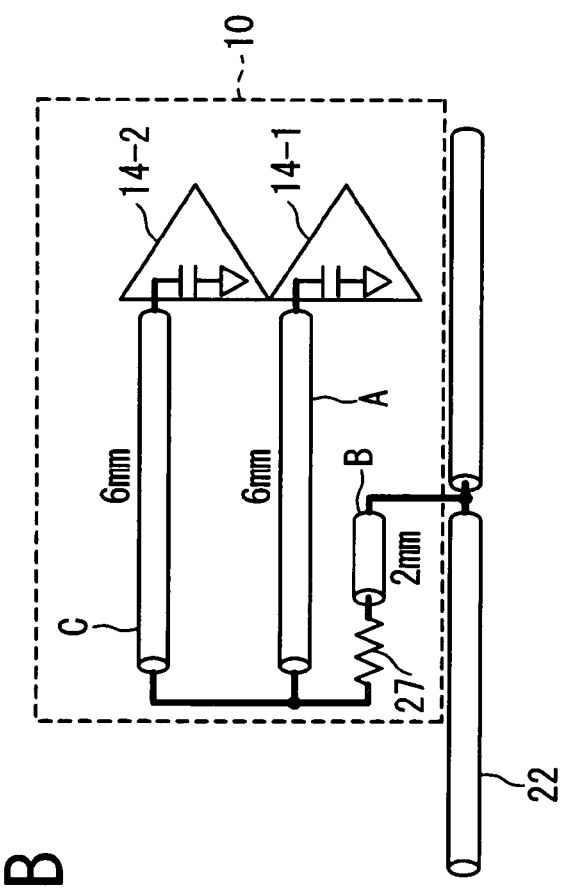

FIGS. 16A and 16B show a configuration of the stacked memory mounted on the memory module according to the fourth embodiment of the present invention. As shown in FIG. 16A, the stacked memory 10 is arranged on the memory module substrate 11 and the wiring in the stacked memory 10 and the signal wiring 22 on the memory module substrate 11 are connected by the ball terminal 16. The ball terminal 16 is of the BGA type.

In the stacked memory 10, the package substrate 12-2 for mounting the memory chip 14-2 is arranged on the package substrate 12-1 for mounting the memory chip 14-1. The package substrates 12-1 and 12-2 are connected through the connection balls 17 which are arranged at the right and left sides thereof. The lower-stage package substrate 12-1 has the package terminals 16 of the BGA type and connected to the memory module substrate 11. In this case, although the substrates 12-1 and 12-2 are connected through the connection balls 17, another method may be used to connect the substrates electrically.

In the lower side surface of the package substrate 12, a portion other than the signal wiring and the opening is covered with the ground layer 21 so that a signal characteristic is stabilized. Wirings on the lower side surface and upper side surface of the package substrate 12 are connected by the via-contacts 24. The wiring in the signal layer of the package substrate 12 is connected to the chip pad 18 of the memory chip 14 to supply a signal to the memory chip 14. Moreover, the resistor 27 is mounted on the lower side surface of the package substrate 12-1. The resistor 27 is a chip resistance having a resistance value in a range of 20 to 500 $\Omega$. Thus, the resistor 27 can be arranged nearby the ball terminals (package terminals) 16 but the size of the package substrate 12 is not increased.

The signal wiring 22 arranged on the memory module substrate 11 is connected to the package substrate 12-1 through one of the ball terminals 16 serving as a package terminal having the BGA structure. The ball terminal 16 is connected to one end of the resistor 27 by the signal wiring B on the lower side surface of the package substrate 12-1 on which the ground layer 21-1 is formed. The other end of the resistor 27 is connected to the connection ball 17 on the upper side surface of the package substrate 12-1 through the via-contact 24. The signal wiring A on the upper side surface of the package substrate 12-1 is connected to the via-contact 24. The signal wiring A is also connected to the chip pad 18-1 of the memory chip 14-1. In this case, the resistor 27 is arranged on the lower side surface of the package substrate 12-1 opposite to the connection ball 17. Thus, the arranging position of the resistor 27 overlaps with the arranging position of the connection ball 17 and an extra area is not necessary. A wiring C in the signal layer of the package substrate 12-2 is connected to the connection ball 17 through the via-contact. Also, the signal wiring C is connected to the chip pad 18-2 of the memory chip 14-2.

The topology of the signal wiring is as shown in FIG. 16B. The signal wiring 22 is connected to the signal wiring B in the stacked memory 10. The signal wiring B having the length of 2 mm is connected to one end of the resistor 27. The wiring is branched into two wirings from the other end of the resistor 27. One of them is connected to the memory chip 14-1 through the signal wiring A having the length of 6 mm. The other wiring is connected to the memory chip 14-2 by the signal wiring C having the length of 6 mm. Thus, the resistor 27 is arranged to the lower side surface of the lower-stage package substrate 12-1 opposite to the connection ball 17. Thereby, even when the memory chip 14 is decreased in size, the resistor 27 can be arranged without taking an occupying area on the package substrate 12, so that the stacked memory 10 can be downsized.

FIGS. 17A to 17C show a configuration of the stacked memory mounted on the memory module according to the fifth embodiment of the present invention. As shown in FIG. 17A, in the fifth embodiment, the stacked memory 10 uses a flexible tape substrate. The stacked memory 10 is arranged on the memory module substrate 11 and the wiring in the stacked memory 10 and the signal wiring 22 on the memory module substrate 11 are connected by the ball terminal 16. The ball terminal 16 is of the BGA type.

The memory chips 14-1 and 14-2 in the stacked memory 10 are mounted on the flexible tape substrate 13 and connected to each other. A printed resistor 50 is arranged on the flexible tape substrate 13 and signal lines are arranged. Because the flexible tape substrate 13 is deformable, the memory chips 14-1 and 14-2 are mounted on one flexible tape substrate 13 by curving it. Therefore, a signal path from the package terminal 16 to the chip pad 18-2 of the uppermost memory chip 14-2 is connected by the continuous tape. For this reason, connection balls 17 are unnecessary in this embodiment.

As shown in FIG. 17C, the printed resistor 50 is formed through drying or baking after paste obtained by mixing binder such as resin or glass with a resistive element 51 such as a metal oxide is printed on a substrate 54 together with a wiring pattern 53 and electrodes 52. Though the printed resistor 50 is formed on the front surface of the substrate, the resistance 50 may be formed in the inner layer of a multi-player substrate.

As shown in FIG. 17B, the topology of the signal wiring in this case becomes the same as that in FIG. 3B described in the first embodiment. That is, the signal wiring 22 is branched into two wirings in the flexible tape substrate 13 of the stacked memory 10. One of them is connected to the memory chip 14-1 through the signal wiring A having the length of 3 mm. The other of them is connected to the printed resistor 50. The other end of the printed resistor 50 is connected to the signal wiring B having the length of 11 mm and connected to the memory chip 14-2 through the signal wiring B. Therefore, the printed resistor 50 arranged for the signal wiring B restrains ringing and the deterioration of the signal waveform is prevented.

FIGS. 18A and 18B show a configuration of the stacked memory mounted on the memory module according to the sixth embodiment of the present invention. As shown in FIG. 18A, in the sixth embodiment, the stacked memory 10 is arranged on the memory module substrate 11. In the stacked memory, the memory chip 14-1 is arranged on the package substrate 12 as in the first embodiment. The memory chip 14-2 is arranged on the memory chip 14-1 back to back with the memory chip 14-1. A wiring in the stacked memory 10 and the signal wiring 22 on the memory module substrate 11 are connected through the ball terminal 16. The ball terminal 16 is of the BGA type. A wiring A in the signal layer of the package substrate 12 is connected to the signal wiring 22 through the ball terminal 16 and connected to the chip pad 18-1 of the memory chip 14-1. The signal wiring 22 is connected to one end of the resistor 27 through the ball terminal 16 arranged on the lower side surface of the package substrate 12. The other end of the resistor 27 is connected to the wiring B arranged in the signal layer of the package substrate 12 through the via-contact 24. The bonding wire as the wiring C is connected to the chip pad 18-2 of the memory chip 14-2 from a bonding land 28 that is connected to the wiring B. Therefore, the connection ball 17 and upper-stage package substrate 12-2 in FIG. 3 are unnecessary and the structure is simplified. The resistor 27 is mounted on the lower side surface of the package substrate 12. On the lower side surface of the package substrate 12, a portion other than the signal wiring area and the openings is covered with the ground layer 21 so that a signal characteristic is stabilized.

As shown in FIG. 18B, the topology of the signal wiring in this case is the same as that shown in FIG. 3B in the first embodiment. That is, the signal wiring 22 is branched into two wirings in the stacked memory 10. One of them is connected to the chip pad 18-1 of the memory chip 14-1 through the signal wiring A. The other of them is connected to the resistor 27. The other end of the resistor 27 is connected to the signal wiring B and connected to the chip pad memory chip 14-2 through the bonding wire (signal wiring C) from the bonding land 28 present at an end of the signal wiring B. Therefore, the resistor 27 arranged for the signal wiring B restrains ringing and the deterioration of the signal waveform is prevented.

FIGS. 19 A and 19B show a configuration of the stacked memory mounted on the memory module according to the seventh embodiment of the present invention. As shown in FIG. 19A, in the memory module in the seventh embodiment, the stacked memory 10 is arranged on the memory module substrate 11. In the stacked memory 10, the memory chips are arranged on the both sides of the package substrate 12. The memory chip 14-2 and the resistor 27 are arranged on the upper side surface of the package substrate 12 and the memory chip 14-1 and the ball terminals 16 are arranged on the lower side surface of the package substrate 12. The ball terminals 16 are arranged at the right and left ends of the package substrate 12 to be connected to the signal wiring 22 on the memory module substrate 11. The ball terminals 16 and the resistor 27 are arranged on the both sides of the package substrate 12 so as to oppose to each other. One end of the resistor 27 is connected to the ball terminal 16 through the via-contact immediately below the one end, and the other end of the resistor 27 is connected to the chip pad 18-2 through a signal wiring D. The chip pads 18-1 and 18-2 of the memory chips 14-1 and 14-2 are arranged on the side of the package substrate 12. The chip pad 18-1 of the memory chip 14-1 is electrically connected to the chip pad 18-2 of the memory chip 14-2 corresponding to the pad 18-1 through the via-contact of the package substrate 12. The signal wiring 22 arranged onto the memory module substrate 11 is connected to the ball terminal 16 arranged at the right or left end of the package substrate 12. The ball terminal 16 is connected to one end of the resistor 27 on the upper side surface of the package substrate 12 opposite to the resistor 27 through the via-contact 24 present in a land. The other end of the resistor 27 is connected to the chip pad 18-2 by the signal wiring D and further connected to the chip pad 18-1 through the via-contact.

The topology of the signal wiring in the seventh embodiment is as shown in FIG. 19B. The signal wiring 22 is connected to one end of the resistor 27 of the stacked memory 10 through the ball terminal 16. The other end of the resistor 27 is connected to the signal wiring D serving as a long stub for the signal wiring 22. The memory chips 14-1 and 14-2 are connected at the other end of the signal wiring D. Through this wiring, the resistor 27 is arranged between the signal wiring 22 and the signal wiring D serving as the stub for the signal wiring and ringing is restrained. Therefore, the deterioration of the signal waveform is prevented.

FIGS. 20A and 20B are diagrams showing a configuration of the stacked memory mounted on the memory module according to the eighth embodiment of the present invention. The structure of the memory module in the eighth embodiment is similar to that the first embodiment. The different point is in that the memory chip with a termination resistance is used as the uppermost memory chip 14-2 without providing the package substrate 12-1 with the resistor 27. The other components of the stacked memory 10 in the eighth embodiment are same as them of the memory module 10 of the first embodiment.

The signal line 22 on the memory module substrate 11 is connected with the signal line A in the signal layer of the package substrate 12-1 and the signal line B through the ball terminal 16 of the BGA structure and the via-contact 24. The short signal line A is connected with the chip pad 18-1 of the memory chip 14-1. Also, the signal line B is connected with the signal line C in the signal layer of the package substrate 12-2 through the connection ball 17. The signal line C is connected with the chip pad 18-2 of memory chip 14-2.

The topology of the signal wiring line of the stacked memory in the eighth embodiment is as shown in FIG. 20B. The signal line 22 on the memory module substrate 11 is branched into the signal line A and the signal line B to the stacked memory 10. The signal line A is 3 mm long and is connected with the memory chip 14-1. The signal line B is 5 mm long and is connected with the memory chip 14-2 via the signal line C of the length of 6 mm. Therefore, in this wiring path, the signal line 22 is connected with the memory chip 14-2 through the signal line of the total length of 11 mm.

Figure 22:
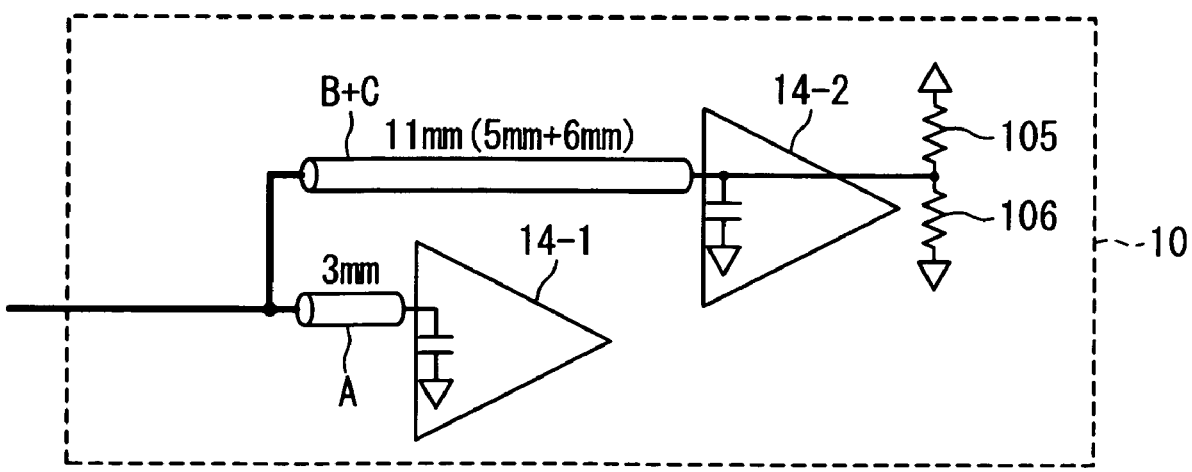
FIG. 22 is a diagram showing a structure of a modification of the stacked memory in the eighth embodiment of the present invention.

In the termination resistance circuit 102 formed in the memory chip 14-2, resistances 105 and 106 are connected in series between the higher potential side power supply line and the lower potential side power supply line. The resistance values of the resistances 105 and 106 may be equal or be different. A connection node of the resistances 105 and 106 is connected with the signal line C. Thus, Thévenin's termination resistance circuit 102 is formed. In this example, the termination resistance circuit 102 is formed in the memory chip 14-2. However, as in the stacked memory shown in FIG. 22, the termination resistance circuit 102 may be formed outside the memory chip 14-2, i.e., on the package substrate 12-2. Also, in case of the memory module shown in FIG. 7, the termination resistance circuit 102 may be provided for all the stacked memories 10. However, it is sufficient if the termination resistance circuit 102 is provided for DRAM1 as the head stacked memory 10.

Figure 21:
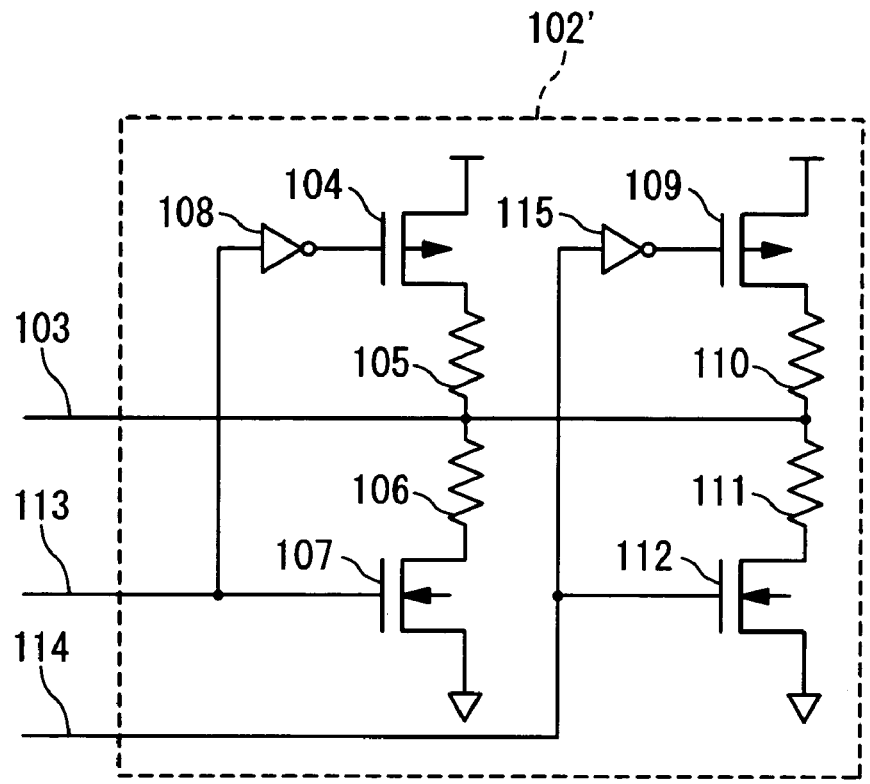
FIG. 21 is a circuit diagram showing a modification of a termination resistance circuit in the memory chip.

FIG. 21 is a circuit diagram showing a termination resistance circuit 102' as a modification of the above termination resistance circuit 102 in the memory chip 14-2. Referring to FIG. 21, the termination resistance circuit 102' includes an input terminal 103 connected with the signal line C, control terminals 113 and 114 and P-type MOS transistors 104 and 109, N-type MOS transistors 107 and 112, resistances 105, 106, 110 and 111, and inverter circuits 108 and 115. For example, the resistance values of the resistances 105 and 106 are 200 Ω and the resistance values of the resistances 110 and 111 is 100 Ω. Thus, in this case, the resistance values of resistance 105 and 106 are different from those of the resistances 110 and 111. The P-type MOS transistors 104 and 109 are connected with the higher potential side power supply line. Also, the N-type MOS transistors 107 and 112 are connected with the lower potential side power supply line. The resistances 105 and 106 are connected in series between the P-type MOS transistor 104 and the N-type MOS transistor 107, and the resistances 110 and 111 are connected in series between the P-type MOS transistor 109 and the N-type MOS transistor 112. A connection node between the resistances 105 and 106 and a connection node between the resistances 110 and 111 are connected with the input terminal 103. The control terminal 113 is connected directly with the gate of N-type MOS transistor 107 and is connected with the gate of P-type MOS transistor 104 through the inverter circuit 108. Also, the control terminal 114 is connected directly with the gate of N-type MOS transistor 1012 and is connected with the gate of P-type MOS transistor 109 through the inverter circuit 115.

In this way, the N-type MOS transistor 107 and P-type MOS transistor 104 are set to the ON state when the control terminal 113 becomes high potential, so that the resistances 105 and 106 forms a first Thévenin's termination circuit to the input terminal 103. Also, the control terminal 114, the resistances 111 and 112, the P-type MOS transistor 109, the N-type MOS transistor 112, and the inverter circuit 113, too, are provided like the above. Thus, the N-type MOS transistor 112 and the P-type MOS transistor 109 are set to the ON state when the control terminal 114 becomes high potential, so that the resistances 110 and 111 forms a second Thévenin's termination resistance circuit to the input terminal 114.

Here, a first Thévenin's termination resistance circuit and a second Thévenin's termination circuit are connected in parallel to the input terminal 103. In this case, in the termination resistance circuit 102', the turning on/off of the first and second termination resistance circuits can be controlled based on application of the control voltage to the control terminals 113 and 114 and the termination resistance value can be changed to the input terminal 103. That is, there are three cases of a state which one of the first and second termination resistance circuits is turned on and a state which both of the first and the second termination resistance circuits are turned on. Thus, the optimal resistance value can be selected in accordance with the impedance of the signal wiring to be used.

In this way, even if the package substrate 12 does not have the resistor 27, the resistance of the termination resistance circuit 102 or 102' in the uppermost memory chip 14-2 eases the signal reflection on the wiring line B+C. Therefore, the signal waveform ringing can be prevented. In case of the memory module shown in FIG. 7, the termination resistance circuit 102 or 102' may be provided for all the stacked memories 10, but it is enough to provide the termination resistance circuit 102 for DRAM1 as the head stacked memory 10.

Figure 23:
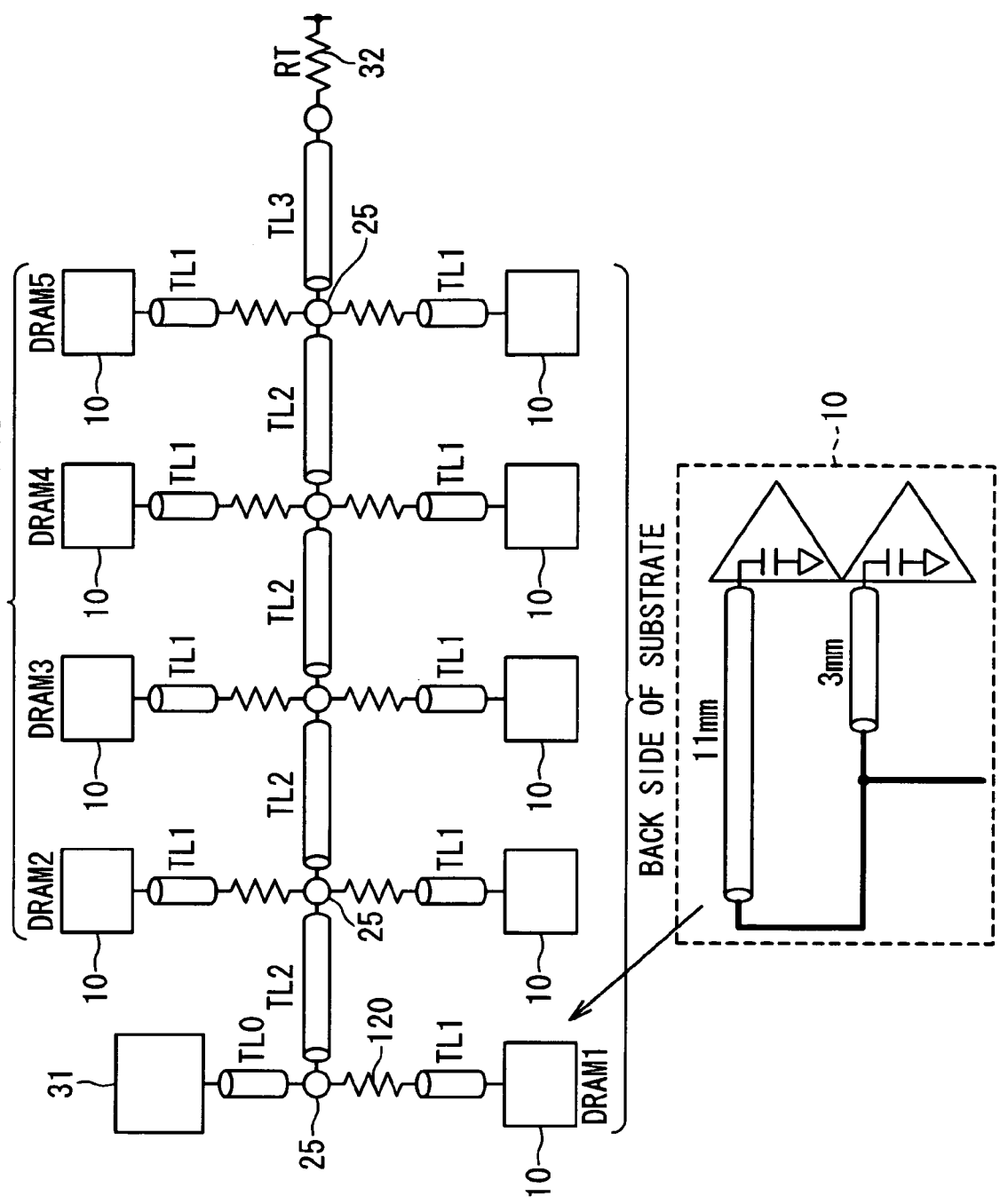
FIG. 23 is a diagram showing a configuration of a memory module according to a ninth embodiment of the present invention.

FIG. 23 is a diagram showing the structure of the memory module according to the ninth embodiment of the present invention. The memory module of the ninth embodiment has a structure like the memory module shown in FIG. 7. The different point is in that a resistance 120 is inserted into each of wirings branched from the stubless wiring line from the memory controller 31 to the termination resistance 32 to connect a signal from the controller 31 to the DRAMs as the stacked memories 10, without providing the package substrate 12-1 with the resistor 27. This resistance is connected with the wiring line B+C in the stacked memory 10 through the above branched wiring. Therefore, the above resistance functions as the damping resistance to the signal reflection onto the above branched wiring and the signal wiring B+C to prevent the signal waveform ringing. The resistance 120 may be provided for each of the stacked memories 10. However, it is enough if the resistance 120 is provided for the DRAM1 as the head stacked memory 10.

Figure 24:
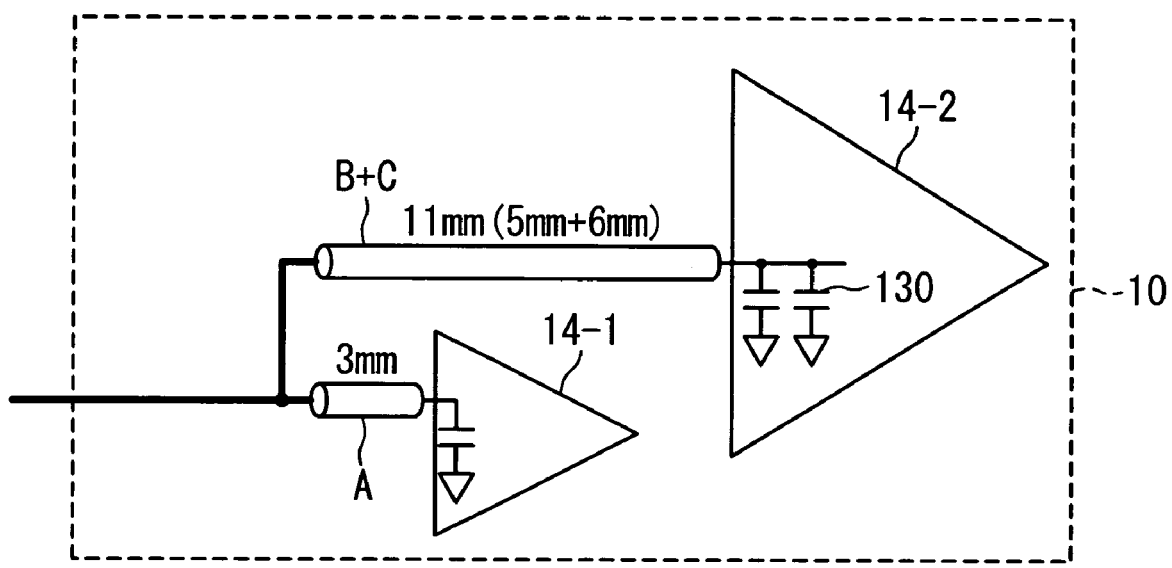
FIG. 24 is a diagram showing a configuration of the memory module according to a tenth embodiment of the present invention.

FIG. 24 is a diagram showing the structure of the memory module according to the tenth embodiment of the present invention. The tenth embodiment is different from the memory module in the eighth embodiment in that the memory chip with a capacitor 130 formed to the input terminal is used as the uppermost memory chip 14-2 without providing the termination resistance circuit 102 for the package substrate 12-2. The other components of the memory module of the tenth embodiment are same as them of the memory module of the eighth embodiment.

The capacitor 130 has the capacitance of about 2 pF in addition to an input capacitance. The capacitor 130 functions as a damping impedance against signal reflection to the signal wiring B+C so that the signal waveform ringing can be prevented. The capacitance 130 may be provided for each of all the stacked memories 10. However, it is enough to provide the capacitor 130 for DRAM1 as the head stacked memory 10.

Also, in the tenth embodiment, the capacitor 130 is provided inside the uppermost memory chip 14-2. However, the capacitor 130 may be provided for another position. For example, it would be understood to a person skilled in the art that the capacitor 130 may be provided outside the uppermost memory chip 14-2 so as to be connected with the input terminal.

As described above, according to the present invention, the damping impedance (resistance and capacitor) is provided for the signal wiring to prevent the ringing due to the reflection signal.

What is claimed is:

1. A semiconductor device system comprising:
    a wiring substrate;
    a plurality of stacked semiconductor devices provided on said wiring substrate and connected with a signal in a stubless wiring, wherein each of said plurality of stacked semiconductor devices further comprises a plurality of semiconductor chips which are stacked; and
    a damping impedance circuit provided in a transmission path of a signal used by a semiconductor chip of said plurality of semiconductor chips which is furthest from said wiring substrate, wherein said damping impedance circuit is provided in at least one stacked semiconductor device of said plurality of stacked semiconductor devices.

2. The semiconductor device system according to claim 1, further comprising:
    a circuit provided on said wiring substrate and configured to output said signal.

3. The semiconductor device system according to claim 1, wherein each of said plurality of stacked semiconductor devices is a stacked semiconductor memory, and
    each of said plurality of semiconductor chips is a memory chip.

4. The semiconductor device system according to claim 1, wherein said damping impedance circuit is a resistance circuit.

5. The semiconductor device system according to claim 1, wherein said damping impedance circuit is a capacitor circuit.

6. The semiconductor device system according to claim 4, wherein said resistance circuit is provided on said wiring substrate.

7. The semiconductor device system according to claim 4, wherein said resistance circuit is provided in said first stacked semiconductor device.

8. The semiconductor device system according to claim 4, wherein said resistance circuit is provided in said uppermost semiconductor chip of said first stacked semiconductor device.

9. The semiconductor device system according to claim 7, wherein said resistance circuit comprises:
    first and second resistances connected in series between a higher potential side power supply line and a lower potential side power supply line, and
    said transmission path of said signal is connected with a connection node between said first resistance and said second resistance.

10. The semiconductor device system according to claim 8, wherein said resistance circuit comprises:
    first and second resistances connected in series between a higher potential side power supply line and a lower potential side power supply line, and
    said transmission path of said signal is connected with a connection node between said first resistance and said second resistance.

11. The semiconductor device system according to claim 7, wherein said resistance circuit comprises:
    first and second switches connected with a higher potential side power supply line;
    third and fourth switches connected with a lower potential side power supply line;
    first and second resistances connected in series between said first switch and said third switch; and
    third and fourth resistances connected in series between said second switch and said fourth switch,
    said transmission path of said signal is connected with a connection node between said first resistance and said second resistance, and a connection node between said third resistance and said fourth resistance, and
    said first and third switches are turned on in response to a first control signal, and said second and fourth switches are turned on in response to a second control signal.

12. The semiconductor device system according to claim 8, wherein said resistance circuit comprises:
    first and second switches connected with a higher potential side power supply line;
    third and fourth switches connected with a lower potential side power supply line;
    first and second resistances connected in series between said first switch and said third switch; and third and fourth resistances connected in series between said second switch and said fourth switch, said transmission path of said signal is connected with a connection node between said first resistance and said second resistance, and a connection node between said third resistance and said fourth resistance, and said first and third switches are turned on in response to a first control signal, and said second and fourth switches are turned on in response to a second control signal.

13. The semiconductor device system according to claim 5, wherein said damping impedance circuit comprises a capacitor between said transmission path of said signal and a lower potential side power supply line.

14. The semiconductor device system according to claim 13, wherein said capacitor is provided in said uppermost semiconductor chip of said first stacked semiconductor device.

15. The semiconductor device system according to claim 1, wherein said at least one stacked semiconductor device is a first semiconductor device to receive said signal.

16. A stacked semiconductor device comprising:
a wiring substrate;
a plurality of semiconductor chips stacked on said wiring substrate;
a damping impedance circuit provided in a transmission path of a signal which is used by an uppermost semiconductor chip of said plurality of semiconductor chips; and
a plurality of ball-like connection terminals provided for an underside of said wiring substrate,
wherein said signal is connected with each of said plurality of semiconductor chips through a specific one of said plurality of ball-like connection terminals.

17. The stacked semiconductor device according to claim 16, wherein said damping impedance circuit is a resistance circuit.

18. The stacked semiconductor device according to claim 16, wherein said damping impedance circuit is a capacitor circuit.

19. The stacked semiconductor device according to claim 17, wherein a lowermost one of said plurality of semiconductor chips is mounted on said wiring substrate,
said signal is electrically connected with said plurality of semiconductor chips other than said lowermost semiconductor chip through connection terminals, and
said resistance circuit is provided for said wiring substrate on a side opposite to said plurality of semiconductor chips.

20. The stacked semiconductor device according to claim 19, wherein a first wiring line which connects said signal with said lowermost semiconductor chip is connected with said resistance circuit is connected with said specific ball-like connection terminal without passing through said resistance circuit, and
a second wiring line which connects said signal with said uppermost semiconductor chip is connected with said specific ball-like connection terminal through said resistance circuit.

21. The stacked semiconductor device according to claim 20, further comprising a third wiring line which connects said resistance circuit with said specific ball-like connection terminal.

22. The stacked semiconductor device according to claim 19, wherein a first wiring line which connects said signal with said lowermost semiconductor chip is connected with said specific ball-like connection terminal through said resistance circuit, and
a second wiring line which connects said signal with said uppermost semiconductor chip is connected with said specific ball-like connection terminal through said resistance circuit.

23. The slacked semiconductor device according to claim 22, further comprising a third wiring line which connects said resistance circuit with said specific ball-like connection terminal.

24. The stacked semiconductor device according to claim 19, wherein said resistance circuit is provided in said uppermost semiconductor chip.

25. The stacked semiconductor device according to claim 24, wherein said resistance circuit comprises:
first and second resistances connected in series between a higher potential side power supply line and a lower potential side power supply line, and
said transmission path of said signal is connected with a node connection between said first resistance and said second resistance.

26. The stacked semiconductor device according to claim 24, wherein said resistance circuit comprises:
first and second switches connected with a higher potential side power supply line;
third and fourth switch connected with a lower potential side power supply line;
first and second resistances connected in series between said switch and said third switch; and
third and fourth resistances connected in series between said second switch and of said fourth switch,
said transmission path of said signal is connected with a connection node between said first resistance and said second resistance, and a connection node between said third resistance and said fourth resistance, and
said first and third switches are turned on in response to a first control signal, and said second and fourth switches are turned on in response to a second control signal.

27. The stacked semiconductor device according to claim 18, wherein said damping impedance circuit comprises a capacitor connected between said transmission path of said signal and a lower potential side power supply line.

28. The stacked semiconductor device according to claim 27, wherein said capacitor is provided in said uppermost semiconductor chip.

* * * * *